United States Patent
Sekikawa et al.

(10) Patent No.: US 8,809,103 B2
(45) Date of Patent: Aug. 19, 2014

(54) METHOD FOR MANUFACTURING ORGANIC SOLAR CELL MODULE

(75) Inventors: Kenta Sekikawa, Tokyo-to (JP); Satoshi Mitsuzuka, Tokyo-to (JP); Miho Sasaki, Tokyo-to (JP)

(73) Assignee: DAI Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 14/009,396

(22) PCT Filed: Apr. 6, 2012

(86) PCT No.: PCT/JP2012/059586
§ 371 (c)(1),
(2), (4) Date: Oct. 2, 2013

(87) PCT Pub. No.: WO2012/137948
PCT Pub. Date: Oct. 11, 2012

(65) Prior Publication Data
US 2014/0024166 A1 Jan. 23, 2014

(30) Foreign Application Priority Data

Apr. 7, 2011 (JP) .................................. 2011-085701

(51) Int. Cl.
*H01L 21/00* (2006.01)
(52) U.S. Cl.
USPC ................... 438/82; 438/64; 438/73; 257/12; 257/15; 257/28; 257/E51.001; 136/253
(58) Field of Classification Search
CPC ......... H01L 51/44; H01L 31/04; H01L 51/00; H01M 14/00
USPC .................... 438/64, 73, 82, 98, 99; 136/253; 257/12, 15, 28, 40, 188, E51.001
See application file for complete search history.

(56) References Cited

U.S. PATENT DOCUMENTS

| 2010/0206461 A1 | 8/2010 | Murray et al. |
| 2011/0088745 A1* | 4/2011 | Usui .............................. 136/244 |
| 2011/0126879 A1 | 6/2011 | Kitamura et al. |

FOREIGN PATENT DOCUMENTS

| JP | 2002-319689 A | 10/2002 |
| JP | 2006-032110 A | 2/2006 |

(Continued)

OTHER PUBLICATIONS

International Search Report; mailed Jun. 19, 2012; PCT/JP2012/059586.

*Primary Examiner* — Mark A Laurenzi
*Assistant Examiner* — Adam S Bowen
(74) *Attorney, Agent, or Firm* — Ladas & Parry LLP

(57) ABSTRACT

A simple method that makes it possible to manufacture a highly-workable organic solar cell module having a plurality of connected organic solar cells is provided. The method includes: a first electrode substrate forming step of forming a plurality of first electrode layers on a first substrate to form a first electrode substrate; preparing a single piece of second electrode substrate-forming base material having at least a second electrode layer and capable of being cut into a plurality of second electrode substrates; a functional layer forming step; a cutting step to form a plurality of second electrode substrates; a bonding step so that the first and second electrode substrates are bonded together; and a connecting step of electrically connecting the first electrode layer of one of the organic solar cells to the second electrode layer of another organic solar cell which is adjacent to the one organic solar cell.

6 Claims, 9 Drawing Sheets

(56) References Cited

FOREIGN PATENT DOCUMENTS

| | | |
|---|---|---|
| JP | 2006-278131 A | 10/2006 |
| JP | 2007-033545 A | 2/2007 |
| JP | 2007-059322 A | 3/2007 |
| JP | 2007-294696 A | 11/2007 |
| JP | 2007-328960 A | 12/2007 |
| JP | 2008-226554 A | 9/2008 |
| JP | 2009-110796 A | 5/2009 |
| JP | 2009-193705 A | 8/2009 |
| JP | 2010-153348 A | 7/2010 |
| JP | 2010-539643 A | 12/2010 |
| JP | 2011-040288 A | 2/2011 |
| JP | 2011-060660 A | 3/2011 |
| WO | 2009/144949 A1 | 12/2009 |

* cited by examiner

METHOD FOR MANUFACTURING ORGANIC SOLAR CELL MODULE

TECHNICAL FIELD

The invention relates to a method for manufacturing an organic solar cell module that makes it possible to manufacture an organic solar cell module at high efficiency and low cost.

BACKGROUND ART

Solar cells currently used can be classified into various types according to light absorption layer material and intended use. Especially, organic solar cells, which contain organic compounds having an electron donating function and an electron accepting function and placed between two different types of electrodes, are attracting attention because they can be manufactured by processes simpler than those for inorganic solar cells, typified by silicon solar cells, can be made to have a larger area at low cost, and can be made colored or flexible.

Organic solar cells generally utilized include dye-sensitized solar cells, which use organic dyes to generate electromotive force, and organic thin-film solar cells, which use organic semiconductors.

To put the organic solar cells into practical use, it is necessary to increase their output voltage. Thus, organic solar cell modules have been developed, which have a plurality of connected organic solar cells.

Concerning methods for manufacturing the organic solar cell modules, for example, Patent Literatures 1 and 2 disclose the following manufacturing methods.

For example, Patent Literature 1 discloses a method for manufacturing an organic thin-film solar cell module, which comprises steps of: forming a first conductive layer and a photoelectric conversion layer in a pattern on a support, forming a second conductive layer and a carrier transport layer in a pattern on a flexible film, and bonding the support and the flexible film together in such a manner that the photoelectric conversion layer and the carrier transport layer are in contact with each other and the first and second conductive layers are partially in contact with each other to be connected in series.

Unfortunately, this manufacturing method has the problem of complicated process because in this method, each layer must be patterned in forming the organic solar cell module.

For example, Patent Literature 2 discloses a method for manufacturing a dye-sensitized solar cell module, which comprises steps of: making a plurality of dye-sensitized solar cells by forming each solid electrolyte layer on each oxide semiconductor electrode substrate having an electrode substrate and a sensitizing dye-bearing porous layer and by bonding each solid electrolyte layer to each counter electrode substrate having a counter electrode layer; and connecting these solar cells to form a dye-sensitized solar cell module.

Unfortunately, this manufacturing method has the problem of involving a large number of steps because the method includes steps of making a plurality of dye-sensitized solar cells, respectively, and steps of connecting dye-sensitized solar cells to each other.

In addition, the dye-sensitized solar cell module manufactured by this method also has the problem that its strength can be insufficient because the dye-sensitized solar cells are individually formed and connected.

Patent Literature 3 discloses a method for manufacturing a dye-sensitized solar cell, which comprises steps of: forming a partition wall layer around the porous layer of the oxide semiconductor electrode substrate mentioned above, applying a pseudo-solid electrolyte to the inside of the partition wall layer, in which the pseudo-solid electrolyte contains a conductive carbon material and a solvent, then removing the solvent to form a pseudo-solid electrolyte layer, and boding the product to the counter electrode substrate to form a dye-sensitized solar cell.

Patent Literatures 4 and 5 respectively discloses a method for manufacturing a dye-sensitized solar cell, which comprises steps of: forming a partition wall part on the counter electrode substrate mentioned above, forming a gel electrolyte layer inside the partition wall part, and then bonding the product to the oxide semiconductor electrode substrate to form a dye-sensitized solar cell.

Unfortunately, the dye-sensitized solar cell-manufacturing methods disclosed in Patent Literatures 3, 4, and 5 have the following problem. If these methods are used to form a dye-sensitized solar cell module, the step of forming the partition wall layers or partition wall parts must be performed, and the counter electrode substrates and the oxide semiconductor electrode substrates must be aligned with high accuracy, so that the manufacturing process will be complicated.

These conventional methods for manufacturing an organic solar cell module all involve a complicated process. Thus, there has been a demand for a method that makes it possible to manufacture an organic solar cell module with higher productivity.

On the other hand, organic solar cell modules are required to have a highly flexible structure so that they can have higher workability.

For example, a conventional flexible organic solar cell module includes a plurality of organic solar cells formed between two flexible substrates.

Unfortunately, such a conventional module has the following problem. If the organic solar cell module having the above structure is bent, the two flexible substrates will have different curvatures, so that it may be difficult to provide the desired bending properties or the organic solar cell module may be damaged by the bending.

Thus, Patent Literature 6 discloses a method for manufacturing a dye-sensitized solar cell module, which comprises steps of: providing a first electrode substrate including a single first substrate and a plurality of first electrode layers formed thereon, providing a plurality of second electrode substrates each having a second electrode layer, arranging the first electrode substrate and the second electrode substrates in such a manner that the plurality of first electrode layers formed on the single first electrode substrate are each opposed to the second electrode layer of the second electrode substrate, bonding the first and second electrode layers together with a sealing agent or an adhesive interposed therebetween, and then injecting an electrolyte between them. This method makes it possible to obtain a highly flexible dye-sensitized solar cell module because in this method, a plurality of first electrode layers are formed on a single first electrode substrate, and each second electrode layer formed on each second electrode substrate can be placed opposite to each first electrode layer on the substrate to form a dye-sensitized solar cell module.

Unfortunately, this manufacturing method has the following problems. In this method, the step of injecting an electrolyte must be performed after the first and second electrode substrates are bonded together, so that it takes a long time to form a large-area cell. In this method, adhesion parts, insulating parts, and other parts must be formed to bond the first and second electrode substrates together, and such adhesion parts, insulating parts, and other parts cannot contribute to power generation in the dye-sensitized solar cell module, which will reduce the total power generation area of the dye-sensitized solar cell module and lower its power generation efficiency and may lead to excessive use of materials such as substrates.

Incidentally, there has been found no manufacturing method capable of forming an organic thin-film solar cell module with good flexibility.

CITATION LIST

Patent Literature

Patent Literature 1: Japanese Patent Application Laid-Open (JP-A) No. 2002-319689
Patent Literature 2: JP-A No. 2009-193705
Patent Literature 3: JP-A No. 2010-153348
Patent Literature 4: JP-A No. 2007-294696
Patent Literature 5: JP-A No. 2007-033545
Patent Literature 6: JP-A No. 2006-032110

SUMMARY OF INVENTION

Technical Problem

The invention has been accomplished in view of the above circumstances, and a main object of the invention is to provide a method for manufacturing an organic solar cell module that makes it possible to manufacture, by a simple process, a highly-workable organic solar cell module having a plurality of connected organic solar cells.

Solution to Problem

To solve the problems mentioned above, the invention provides a method for manufacturing an organic solar cell module comprising: a first electrode substrate having a single first substrate and a plurality of first electrode layers formed in a pattern on the first substrate; a plurality of second electrode substrates each having at least a second electrode layer; and a plurality of functional layers each formed between the first electrode layer and the second electrode layer and containing an organic material, wherein the organic solar cell module includes a plurality of connected organic solar cells each having the first electrode layer, the second electrode layer, and the functional layer, the method comprising steps of: a first electrode substrate forming step of forming the plurality of first electrode layers on the first substrate to form the first electrode substrate; a second electrode substrate-forming base material preparing step of preparing a single piece of second electrode substrate-forming base material having at least the second electrode layer and capable of being cut into the plurality of second electrode substrates; a functional layer forming step of either forming the functional layers on a side of the first electrode layer of the first electrode substrate, in which the functional layers are formed in a pattern corresponding to the pattern of the first electrode layers, or continuously forming the functional layer on a side of the second electrode layer of the second electrode substrate-forming base material; a cutting step of cutting the second electrode substrate-forming base material to form the plurality of second electrode substrates; a bonding step of opposing and bonding the first electrode layer side of the first electrode substrate and the second electrode layer side of the second electrode substrate to each other with the functional layer interposed therebetween so that the first electrode substrate and the second electrode substrate are bonded together; and a connecting step of electrically connecting the first electrode layer of one of the organic solar cells to the second electrode layer of another organic solar cell which is adjacent to the one organic solar cell.

According to the invention, the bonding step enables the organic material-containing functional layer to be placed at the interface, so that the first and second electrode substrates can be sufficiently bonded together with the functional layer.

According to the invention, for example, the functional layer may be formed on the first electrode layer side of the first electrode substrate in the functional layer forming step. In this case, the functional layer can be formed with a width larger than the width of the patterned first electrode layer, so that in the resulting organic solar cell module, the first and second electrode layers are prevented from coming into contact with each other in each piece of organic solar cell and thus internal shorts are successfully prevented.

On the other hand, for example, the functional layer may be formed on the second electrode layer side of the second electrode substrate-forming base material. In this case, the functional layer can be continuously formed on the second electrode substrate-forming base material, and then cut into pieces of a desired shape in the later cutting step. In this case, therefore, it is not necessary to form each functional layer in a pattern corresponding to the pattern of each first electrode layer, and thus the functional layer forming step can be simplified. In addition, a waste of materials and others used to form the functional layer can be reduced because there is no need to form each functional layer in a pattern corresponding to the pattern of each first electrode layer.

In the invention, the first substrate is preferably a long flexible substrate wound into a roll shape, and the first electrode substrate forming step and the functional layer forming step of forming the functional layers on the first electrode layer side of the first electrode substrate are preferably performed using a roll-to-roll process (hereinafter, also referred to as an "R-to-R process" in the description). When the first electrode layer forming step and the functional layer forming step are performed using an R-to-R process, the organic solar cell module can be manufactured with high productivity.

In the invention, the second electrode substrate-forming base material is preferably a long flexible base material wound into a roll shape, and the functional layer forming step of forming the functional layer on the second electrode layer side of the second electrode substrate-forming base material is preferably performed using an R-to-R process. When the functional layer forming step is performed using an R-to-R process, the organic solar cell module can be manufactured with high productivity.

In the invention, the organic solar cell module is preferably a dye-sensitized solar cell module that comprises a plurality of connected dye-sensitized solar cells each having a porous layer provided on the surface of either the first electrode layer or the second electrode layer, in which the porous layer contains sensitizing dye-bearing fine particles of metal oxide semiconductor, and the functional layer is a solid electrolyte layer containing a polymer compound and a redox couple. When the functional layer is a solid electrolyte layer, there is no need to form a sealing material or the like, which would otherwise be necessary to seal a liquid electrolyte in a conventional dye-sensitized solar cell module, so that a dye-sensitized solar cell module with high power generation efficiency can be manufactured with high productivity.

Also in the invention, the second electrode layer is preferably a metal layer, and the porous layer is preferably formed on the metal layer. When the second electrode layer is a highly heat-resistant metal layer, the porous layer can be directly fired and formed on the metal layer, which makes simpler the method for manufacturing a dye-sensitized solar cell module.

In the invention, the organic solar cell module is preferably an organic thin-film solar cell module comprising a plurality of connected organic thin-film solar cells each having a photoelectric conversion layer between the first electrode layer and the second electrode layer, wherein the functional layer is preferably an organic material-containing layer formed between the first electrode layer and the second electrode layer. This makes it possible to manufacture a highly-workable organic thin-film solar cell module with high productivity.

Advantageous Effects of Invention

In the method of the invention for manufacturing an organic solar cell module, a plurality of first electrode layers formed on a single first substrate are successfully bonded to second electrode layers formed on a plurality of second electrode substrates with organic material-containing functional layers interposed therebetween, respectively, which leads to the advantageous effect that an organic solar cell module having a highly workable structure can be manufactured by a simple process.

DESCRIPTION OF EMBODIMENTS

Figure 1A:
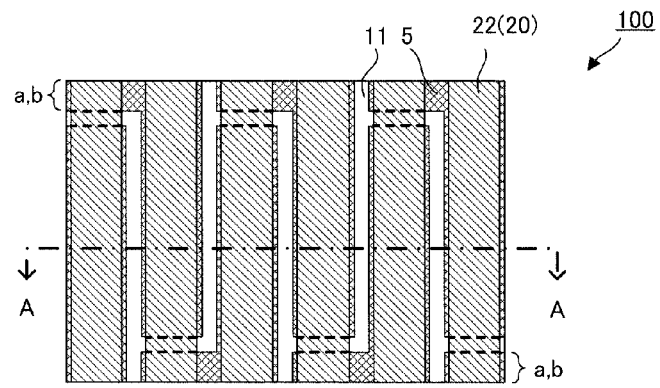
FIGS. 1A and 1B are each as schematic views showing an example of a dye-sensitized solar cell module manufactured by the method of the invention for manufacturing an organic solar cell module.

Hereinafter, the method of the invention for manufacturing an organic solar cell module will be described.

The invention is directed to a method for manufacturing an organic solar cell module comprising: a first electrode substrate having a single first substrate and a plurality of first electrode layers formed in a pattern on the first substrate; a plurality of second electrode substrates each having at least a second electrode layer; and a plurality of functional layers each formed between the first electrode layer and the second electrode layer and containing an organic material, wherein the organic solar cell module comprises a plurality of connected organic solar cells each having the first electrode layer, the second electrode layer, and the functional layer, the method comprises steps of: a first electrode substrate forming step of forming the plurality of first electrode layers on the first substrate to form the first electrode substrate; a second electrode substrate-forming base material preparing step of preparing a single piece of second electrode substrate-forming base material having at least the second electrode layer and capable of being cut into the plurality of second electrode substrates; a functional layer forming step of either forming the functional layers on a side of the first electrode layer of the first electrode substrate, in which the functional layers are formed in a pattern corresponding to the pattern of the first electrode layers, or continuously forming the functional layer on a side of the second electrode layer of the second electrode substrate-forming base material; a cutting step of cutting the second electrode substrate-forming base material to form the plurality of second electrode substrates; a bonding step of opposing and bonding the first electrode layer side of the first electrode substrate and the second electrode layer side of the second electrode substrate to each other with the functional layer interposed therebetween so that the first electrode substrate and the second electrode substrate are bonded together; and a connecting step of electrically connecting the first electrode layer of one of the organic solar cells to the second electrode layer of another organic solar cells which is adjacent to the one organic solar cell.

Incidentally, in the organic solar cell module manufactured according to the invention, at least one of the first electrode substrate or the second electrode substrate forms a sunlight receiving surface. In the invention, therefore, the organic solar cell module is usually manufactured in such a manner that at least one of the first and second electrode substrates is a substrate having transparency.

Herein, the transparency of the phrase "substrate having transparency" is not particularly restricted as long as sunlight can be so transmitted through the substrate that the organic solar cell module manufactured by the method of the invention can function when it receives the sunlight. Preferably, the substrate having transparency has a total light transmittance of 50% or more. Incidentally, this transparency is the value measured by the measurement method according to JIS K 7361-1:1997.

As regards the functional layer forming step according to the invention, the term "forming the functional layers on a side of the first electrode layer" or "forming the functional layer on a side of the second electrode layer" is intended to include not only a case where the functional layer is formed directly on the surface of the first or second electrode layer but also a case where the functional layer is formed on the electrode layer with any other layer interposed therebetween.

The expression "the functional layers are formed in a pattern corresponding to the pattern of the first electrode layers" means that each functional layer is formed on each patterned first electrode layer in such a manner that the functional layer is contained in each organic solar cell constituting the organic solar cell module manufactured by the method of the invention. Specifically, it means that a single functional layer is formed in a continuously formable pattern on a first electrode layer.

As regards the bonding step according to the invention, the term "opposing and bonding the first electrode layer side of the first electrode substrate and the second electrode layer side of the second electrode substrate to each other with the functional layer interposed therebetween" is intended to include not only a case where the first and second electrode layers are bonded together with the functional layer interposed therebetween but also a case where the uppermost layer on the first electrode layer and the upper most layer on the second electrode layer are bonded together with the functional layer interposed therebetween if any other layer is formed on the surface of the first or second electrode layer.

According to the invention, the bonding step makes it possible to place the organic material-containing functional layer at the interface, so that the first and second electrode substrates can be sufficiently bonded together.

According to the invention, the functional layer forming step mentioned above can bring about the following advantageous effects.

For example, the functional layer may be formed on the first electrode layer side of the first electrode substrate. In this case, the functional layer can be formed with a width larger than the width of the patterned first electrode layer, so that in the resulting organic solar cell module, the first and second electrode layers are prevented from coming into contact with each other in each piece of organic solar cell and thus internal shorts are successfully prevented.

On the other hand, for example, the functional layer may be formed on the second electrode layer side of the second electrode substrate-forming base material. In this case, the functional layer can be continuously formed on the second electrode substrate-forming base material, and then cut into pieces of a desired shape in the later cutting step. In this case, therefore, it is not necessary to form each functional layer in a pattern corresponding to the pattern of each first electrode layer, and thus the functional layer forming step can be simplified. In addition, a waste of materials and others used to form the functional layer can be reduced because there is no need to form each functional layer in a pattern corresponding to the pattern of each first electrode layer.

The invention also makes it possible to form an organic solar cell module having a single first electrode substrate and a plurality of second electrode substrates. Thus, when the first electrode substrate and the second electrode substrates used each have flexibility, an easily-bendable, organic solar cell module with a high level of strength and workability can be manufactured.

Herein, the method of the invention for manufacturing an organic solar cell module may be broadly divided into two modes, depending on the type of the organic solar cell module to be manufactured.

Specifically, the organic solar cell module may be a dye-sensitized solar cell module (first mode), which comprises a plurality of connected dye-sensitized solar cells each having a porous layer provided on the surface of either the first electrode layer or the second electrode layer, in which the porous layer contains sensitizing dye-bearing fine particles of metal oxide semiconductor, and the functional layer is a solid electrolyte layer containing a polymer compound and a redox couple; or may be an organic thin-film solar cell module (second mode), which comprises a plurality of connected organic thin-film solar cells each having a photoelectric conversion layer between the first and second electrode layers, in which the functional layer is an organic material-containing layer formed between the first and second electrode layers.

Hereinafter, each mode will be described.

I. First Mode

A first mode of the method of the invention for manufacturing an organic solar cell module is a method for manufacturing a dye-sensitized solar cell module that comprises a plurality of connected dye-sensitized solar cells each having a porous layer provided on the surface of either the first electrode layer or the second electrode layer, in which the porous layer contains sensitizing dye-bearing fine particles of metal oxide semiconductor, and the functional layer is a solid electrolyte layer containing a polymer compound and a redox couple.

Incidentally, in the following description, the organic solar cell module will be referred to as the dye-sensitized solar cell module.

In the dye-sensitized solar cell module manufactured by the method in this mode, the porous layer-carrying electrode layer, out of the first and second electrode layers, is generally used as an oxide semiconductor electrode layer, and the other electrode layer with no porous layer is generally used as a counter electrode layer.

Now, the dye-sensitized solar cell module manufactured by the method in this mode will be described with reference to the drawings. FIG. 1A is a schematic plan view showing an example of a dye-sensitized solar cell module manufactured by the method in this mode, and FIG. 1B is a cross-sectional view along the line A-A in FIG. 1A.

Figure 1B:
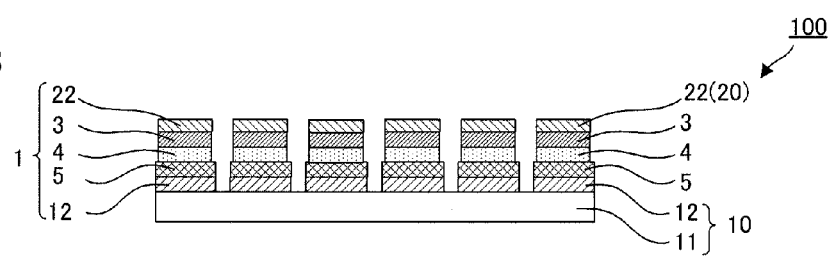

As shown in FIGS. 1A and 1B, the dye-sensitized solar cell module 100 manufactured by the method in this mode comprises a first electrode substrate 10 having a single first substrate 11 and a plurality of first electrode layers 12 formed in a pattern on the first substrate 11; a plurality of second electrode substrates 20 each having at least a second electrode layer 22; a porous layer 3 formed on each second electrode layer 22; and a solid electrolyte layer 4 formed between each first electrode layer 12 of the first electrode substrate 10 and each porous layer 3 formed on each second electrode substrate 20.

Incidentally, in the dye-sensitized solar cell module 100, a catalyst layer 5 is preferably formed between each first electrode layer 12 and each solid electrolyte layer 4.

The dye-sensitized solar cell module 100 comprises a plurality of connected dye-sensitized solar cells 1 each having the first electrode layer 12, the catalyst layer 5, the solid electrolyte layer 4, the porous layer 3, and the second electrode layer 22.

In the dye-sensitized solar cell module 100 shown in FIG. 1A, the first electrode layers 12 are formed in a stripe pattern, and the second electrode substrates each having the second electrode layer 22 are each formed in a strip shape. The dye-sensitized solar cell module 100 also has connection parts "a" each containing the short-side end of each stripe of the first electrode layer 12, and also has connection parts "b" each containing the short-side end of the strip of each second electrode layer 22, in which the connection part "a" of the first electrode layer 12 of one dye-sensitized solar cell 1 is directly in contact with the connection part "b" of the second electrode layer 22 of another dye-sensitized solar cell 1 adjacent to the one dye-sensitized solar cell 1 so that the cells are electrically connected.

Figure 2:
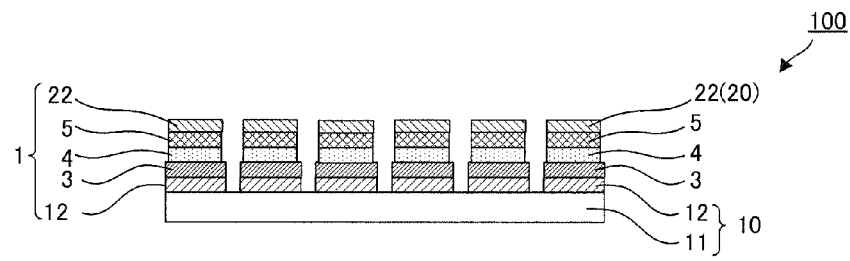
FIG. 2 is a schematic cross-sectional view showing another example of a dye-sensitized solar cell module manufactured by the method of the invention for manufacturing an organic solar cell module.

As shown in FIG. 2, the method in this mode may also be used to manufacture a dye-sensitized solar cell module 100 having a patterned porous layer 3 on each first electrode layer 12. In this case, a catalyst layer 5 is also preferably formed between each second electrode layer 22 and each solid electrolyte layer 4.

Incidentally, FIG. 2 is a schematic cross-sectional view showing another example of the dye-sensitized solar cell module manufactured by the method in this mode, and the reference signs not described here represent the same as those in FIG. 1. Thus, a description of such components will be omitted here.

Figure 3A:
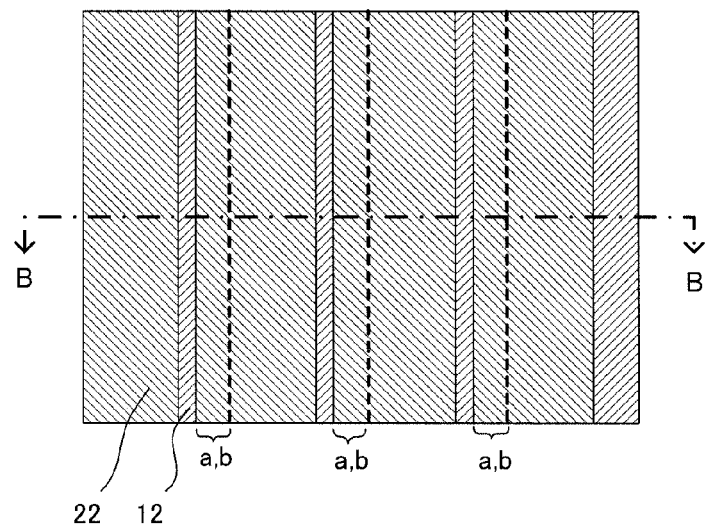
FIGS. 3A and 3B are each a schematic views showing a further example of a dye-sensitized solar cell module manufactured by the method of the invention for manufacturing an organic solar cell module.

FIG. 3A is a schematic cross-sectional view showing another example of the dye-sensitized solar cell module manufactured by the method in this mode, and FIG. 38 is a cross-sectional view along the line B-B in FIG. 3A. The dye-sensitized solar cell module 100 shown in FIGS. 3A and 3B has connection parts "a" each containing the long-side end of each stripe of the first electrode layer 12, and also has connection parts "b" each containing the long-side end of the strip of each second electrode layer 22, in which the connection part "a" of the first electrode layer 12 of one dye-sensitized solar cell 1 is directly in contact with the connection part "b" of the second electrode layer 22 of another dye-sensitized solar cell 1 adjacent to the one dye-sensitized solar cell 1 so that the cells are electrically connected.

Incidentally, the reference signs in FIGS. 3A and 38 not described here represent the same as those in FIGS. 1A and 1B, and a description of such components will be omitted here.

As mentioned above, the dye-sensitized solar cell module manufactured by the method in this mode has a porous layer as an essential component. In this mode, therefore, a porous layer forming step of forming a porous layer on the surface of either the first electrode layer or the second electrode layer is essential in addition to each step described above.

More specifically, the method for manufacturing the dye-sensitized solar cell module in this mode comprises steps of: a first electrode substrate forming step of forming the plurality of first electrode layers on the first substrate to form the first electrode substrate; a second electrode substrate-forming base material preparing step of preparing a single piece of second electrode substrate-forming base material having at least the second electrode layer and capable of being cut into the plurality of second electrode substrates; a porous layer forming step of forming a porous layer on the surface of either the first electrode layer or the second electrode layer, in which the porous layer contains sensitizing dye-bearing fine particles of metal oxide semiconductor; a functional layer forming step of either forming the functional layers on the first electrode layer side of the first electrode substrate, in which the functional layers are formed in a pattern corresponding to the pattern of the first electrode layers, or continuously forming the functional layer on the second electrode layer side of the second electrode substrate-forming base material; a cutting step of cutting the second electrode substrate-forming base material to form the plurality of second electrode substrates; a bonding step of opposing and bonding the first electrode layer side of the first electrode substrate and the second electrode layer side of the second electrode substrate to each other with the functional layer interposed therebetween so that the first and second electrode substrates are bonded together; and a connecting step of electrically connecting the first electrode layer of one of the dye-sensitized solar cells to the second electrode layer of another dye-sensitized solar cells which is adjacent to the one dye-sensitized solar cell.

Now, the method for manufacturing the dye-sensitized solar cell module in this mode will be described with reference to the drawings. FIGS. 4A to 4D and FIGS. 6A to 6E are process drawings showing an example of the method for manufacturing the dye-sensitized solar cell module in this mode, which illustrate an example of the manufacture of the dye-sensitized solar cell module shown in FIGS. 1A and 1B. FIGS. 5A to 5D and FIGS. 7A to 7E are process drawings showing another example of the method for manufacturing the dye-sensitized solar cell module in this mode, which illustrate an example of the manufacture of the dye-sensitized module shown in FIGS. 3A and 3B.

Figure 4A:
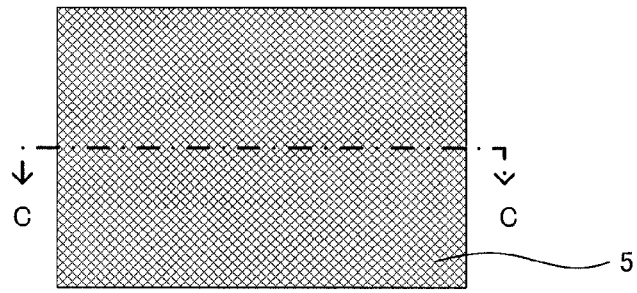
FIGS. 4A to 4D are a process drawing showing an example of the first electrode substrate forming step in the method of the invention for manufacturing an organic solar cell module.
Figure 4B:
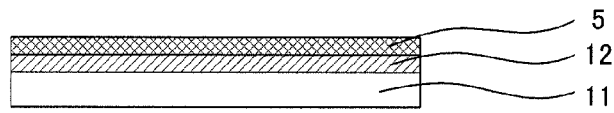

The first electrode substrate forming step in this mode will be first described. As shown in FIGS. 4A and 4B, the first electrode substrate forming step includes continuously forming a first electrode layer 12 on a first substrate 11. A catalyst layer 5 may also be formed in the first electrode substrate forming step. In this case, the catalyst layer 5 may be continuously formed or deposited on the first electrode layer 12. Incidentally, FIG. 4A is a top view showing an example of the first substrate 11 on which the first electrode layer 12 and the catalyst layer 5 are continuously formed. FIG. 4B is a cross-sectional view along the line C-C in FIG. 4A.

Figure 4C:
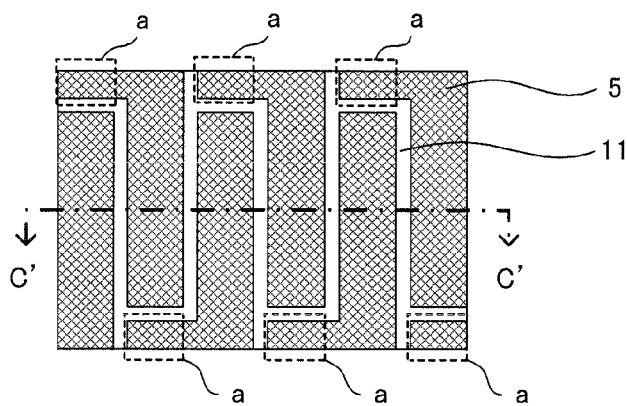
Figure 4D:
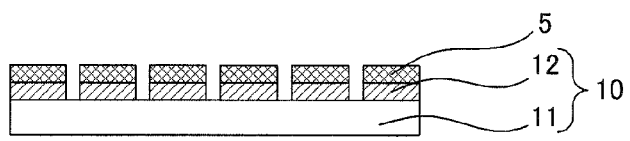

Subsequently, as shown in FIGS. 4C and 4D, the first electrode layer 12 and the catalyst layer 5 are patterned into a predetermined pattern by etching or other processes, so that a first electrode substrate 10 is formed, which includes a single first substrate 11 and a plurality of first electrode layers 12 and catalyst layers 5 formed in a pattern on the first substrate 11. FIG. 4C shows an example where the first electrode layers 12 and the catalyst layers 5 are formed in a stripe pattern, and each first electrode layer 12 and each catalyst layer 5 are so formed as to have a connection part "a" containing the short-side end of the stripe.

Incidentally, FIG. 4C is a top view showing an example of the first electrode substrate 10 formed by the first electrode substrate forming step, and FIG. 4D is a cross-sectional view along the line C'-C' in FIG. 4C.

Figure 5A:
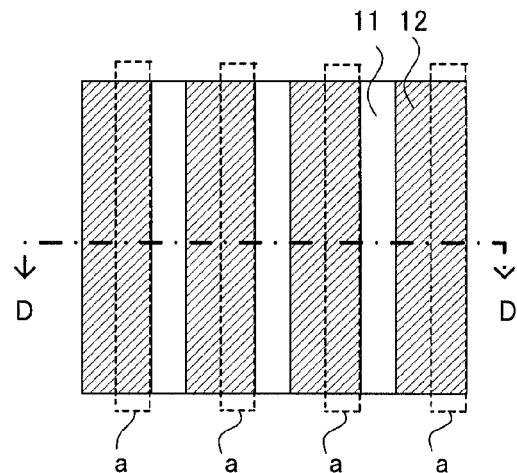
FIGS. 5A to 5D are a process drawing showing another example of the first electrode substrate forming step in the method of the invention for manufacturing an organic solar cell module.
Figure 5B:
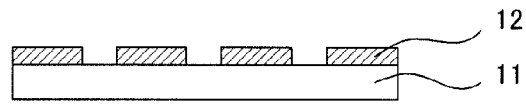

As shown in FIGS. 5A and 5B, the first electrode substrate forming step may alternatively include forming a plurality of first electrode layers 12 in a predetermined pattern directly on a first substrate 11, for example, by vapor deposition or other methods using a metal mask or the like. FIG. 5A shows an example where the first electrode layers 12 are formed in a stripe pattern, and each first electrode layer 12 is so formed as to have a connection part "a" containing the long-side end of the stripe.

Incidentally, FIG. 5A is a top view showing an example of the first substrate on which the first electrode layers 12 are formed in a pattern, and FIG. 5B is a cross-sectional view along the line D-D in FIG. 5A.

Figure 5C:
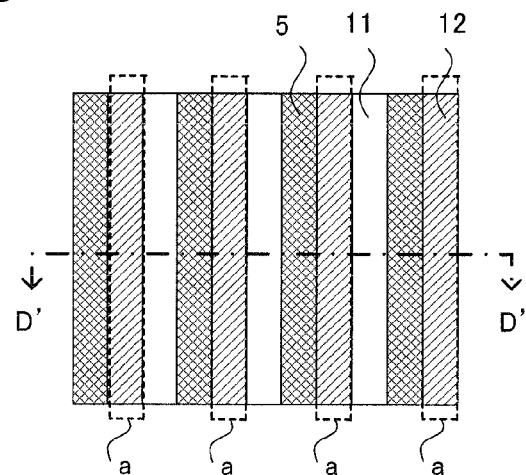
Figure 5D:
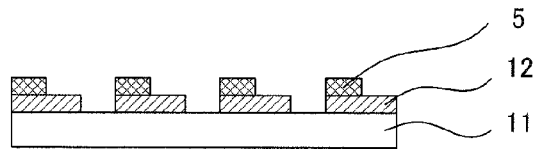

As shown in FIGS. 5C and 5D, the catalyst layers 5 formed on the first electrode layers 12 may have a different pattern from that of the first electrode layers 12.

Incidentally, FIG. 5C is a top view showing another example of the first electrode substrate 10 formed by the first electrode substrate forming step, and FIG. 5D is a cross-sectional view along the line D'-D' in FIG. 5C.

Figure 6A:
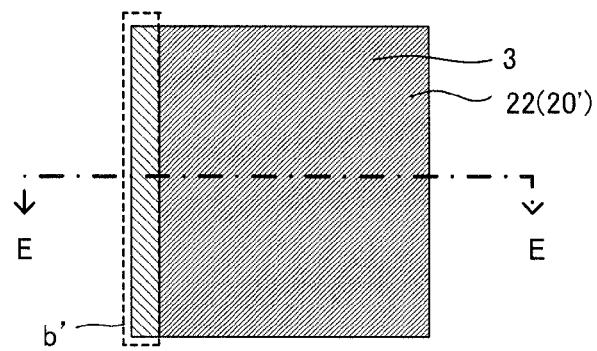
FIGS. 6A to 6E, are a process drawing showing an example of the second electrode substrate-forming base material preparing step, porous layer forming step, functional layer forming step, and cutting step in the method of the invention for manufacturing an organic solar cell module.

Next, the second electrode substrate-forming base material preparing step and the porous layer forming step in this mode will be described. As shown in FIGS. 6A and 68 and FIGS. 7A and 7B, the second electrode substrate-forming base material preparing step includes preparing a second electrode substrate-forming base material 20' having a second electrode layer 22. Subsequently, the porous layer forming step is performed to continuously form a porous layer 3 on the second electrode layer 22, in which the porous layer 3 contains sensitizing dye-bearing fine particles of metal oxide semiconductor. Incidentally, in the connection step described below, the first and second electrode layers of adjacent dye-sensitized solar cells may be electrically connected using internal part of the dye-sensitized solar cell module. In this case, it is preferred that as shown in FIGS. 6A and 6B, the porous layer 3 should be continuously formed on a part other than a part b' used to form the connection part of the second electrode layer 22 in the second electrode substrate obtained by cutting the second electrode substrate-forming base material 20' (hereinafter, the part b' is also referred to as the connection part b' of the second electrode substrate-forming base material 20' in the description).

Figure 6B:

Incidentally, FIG. 6A is a top view showing an example of the second electrode substrate-forming base material on which the porous layer 3 is formed by the porous layer forming step, and FIG. 6B is a cross-sectional view along the line E-E in FIG. 6A.

Figure 7A:
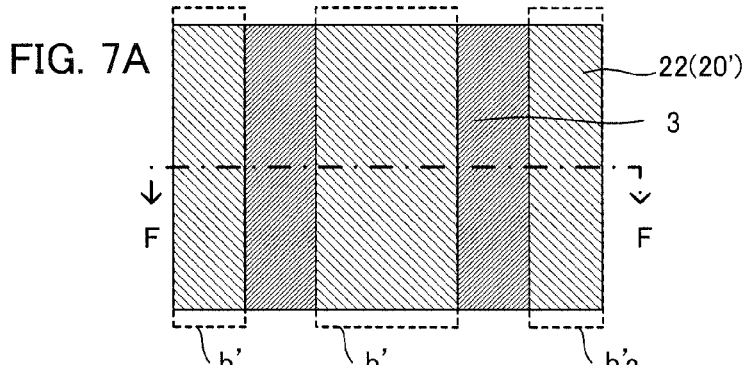
FIGS. 7A to 7E are a process drawing showing another example of the second electrode substrate-forming base material preparing step, porous layer forming step, functional layer forming step, and cutting step in the method of the invention for manufacturing an organic solar cell module.
Figure 7B:
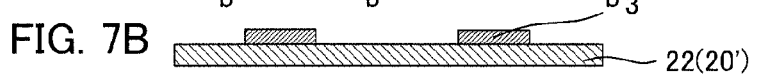

Alternatively, as shown in FIGS. 7A and 7B, porous layers 3 may be continuously formed in a predetermined pattern in the porous layer forming step. Incidentally, FIG. 7A shows an example where porous layers 3 are continuously formed in a stripe pattern on parts other than the connection parts b' of the second electrode substrate-forming base material 20'.

Incidentally, FIG. 7A is a top view showing another example of the second electrode substrate-forming base material 20' on which the porous layers 3 are formed by the porous layer forming step, and FIG. 7B is a cross-sectional view along the line F-F in FIG. 7A.

Incidentally, although not shown, the porous layer may be alternatively formed on the first electrode layer in the porous layer forming step.

Next, the functional layer forming step in this mode will be described.

As shown in FIGS. 6C and 6D and FIGS. 7C and 7D, the functional layer forming step includes continuously forming a solid electrolyte layer 4 on the porous layer 3 on the second electrode substrate-forming base material 20' mentioned above, in which the solid electrolyte layer 4 contains a polymer compound and a redox couple.

Figure 6C:
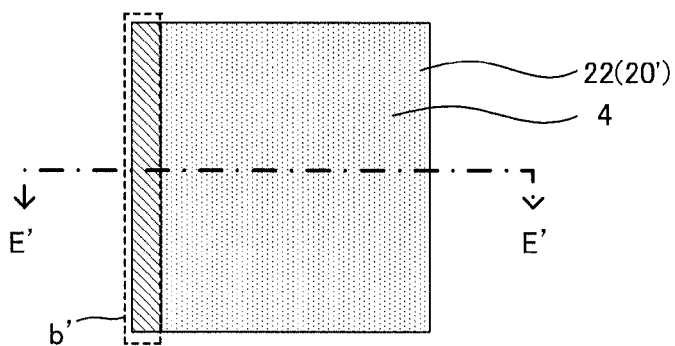
Figure 6D:
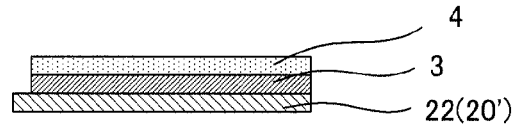
Figure 7C:
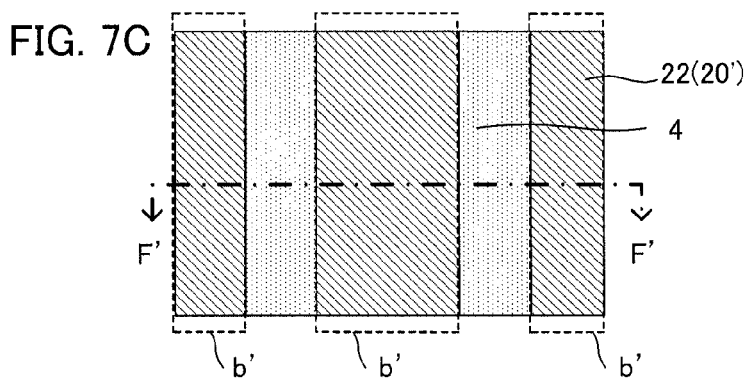
Figure 7D:

Incidentally, FIG. 6C is a top view showing an example of the second electrode substrate-forming base material 20' on which a solid electrolyte layer 4 is formed, and FIG. 6D is a cross-sectional view along the line E'-E' in FIG. 6C. FIG. 7C is a top view showing another example of the second electrode substrate-forming base material 20' on which solid electrolyte layers 4 are formed, and FIG. 7D is a cross-sectional view along the line F'-F' in FIG. 7C.

Incidentally, although not shown, the functional layer forming step may alternatively include forming solid electrolyte layers on the first electrode layers of the first electrode substrate, in a pattern corresponding to the pattern of the first electrode layers.

Next, the cutting step in this mode will be described.

Figure 6E:
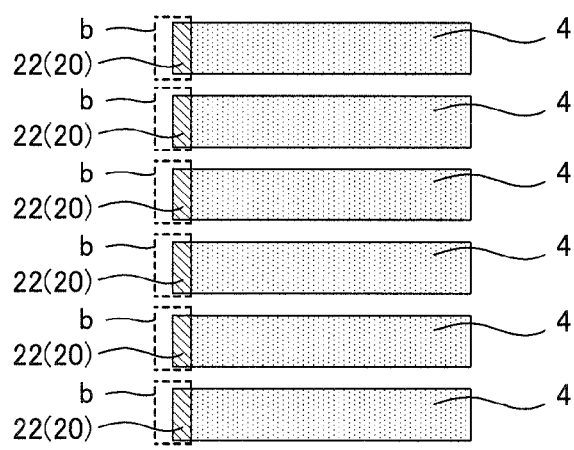
Figure 7E:
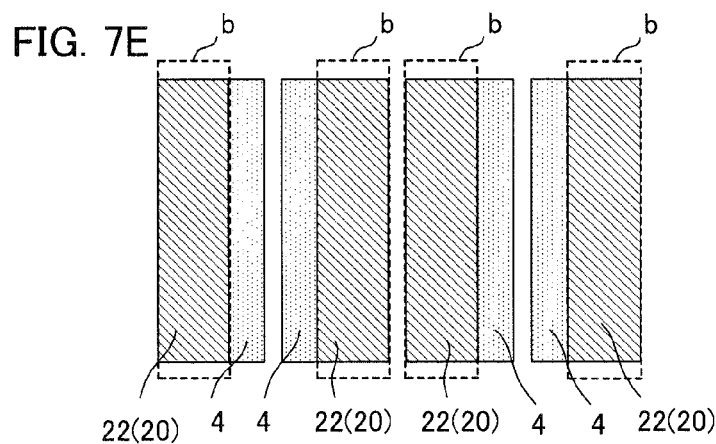

As shown in FIG. 6E and FIG. 7E, the cutting step includes cutting the second electrode substrate-forming base material 20' into pieces of a desired shape to form second electrode substrates 20. Incidentally, FIGS. 6E and 7E all show an example where the second electrode substrates 20 are formed in such a manner that adjacent second electrode substrates 20 are not in contact with each other in the resulting dye-sensitized solar cell module.

Next, the bonding step and the connecting step in this mode will be described. The bonding step includes opposing and bonding each catalyst layer formed on the first electrode substrate to each porous layer formed on the second electrode substrate with each solid electrolyte layer interposed therebetween so that the first and second electrode substrates are bonded together. In the bonding step, for example, the first and second electrode substrates may be bonded together in such a manner that part of the first electrode layer of one dye-sensitized solar cell is brought into contact with part of the second electrode layer of another dye-sensitized solar cell adjacent to the one dye-sensitized solar cell, so that the connecting step can also be performed at the same time. Incidentally, specific examples of the bonding step and the connecting step will be described below.

When the above steps are performed, the dye-sensitized solar cell module shown in FIGS. 1A and 1B or FIGS. 3A and 3B is successfully manufactured.

In this mode, the solid electrolyte layer is used as the functional layer, and thus there is no need to use a sealing material, an adhesive, or the like, which would otherwise be necessary if a liquid electrolyte is used. This makes it possible to reduce manufacturing cost and to form a dye-sensitized solar cell module using a simple process. When a sealing material, an adhesive, or the like is unnecessary, the area that contributes to power generation can be increased, so that a dye-sensitized solar cell module having high power generation efficiency can be manufactured.

Hereinafter, each step of the method for manufacturing the dye-sensitized solar cell module in this mode will be described.

1. First Electrode Substrate Forming Step

In this mode, the first electrode substrate forming step includes forming a plurality of first electrode layers on a first substrate to form a first electrode substrate.

Now, the first electrode substrate formed by this step will be described.

The first electrode substrate formed by this step includes a first substrate and first electrode layers formed on the first substrate.

The first electrode substrate may be a substrate having transparency or no transparency, which may be appropriately selected depending on which side is used as the light receiving surface for the dye-sensitized solar cell module manufactured according to this mode.

When the second electrode substrate has transparency, the first electrode substrate formed in this step may be a substrate having transparency or no transparency.

On the other hand, when the second electrode substrate has no transparency, a substrate having transparency is formed as the first electrode substrate in this step.

Hereinafter, each substrate will be described.

(1) Substrate Having Transparency

The first electrode substrate having transparency generally includes a transparent substrate as the first substrate and transparent electrode layers formed as the first electrode layers on the transparent substrate.

(a) First Substrate

As mentioned above, a transparent substrate is used as the first substrate to form the first electrode substrate having transparency.

The transparent substrate is used to support the transparent electrode layers described below.

For example, an inorganic transparent substrate or a resin substrate may be used as such a transparent substrate. Among them, a resin substrate is preferable in that it is lightweight, has high workability, and can reduce manufacturing cost.

Examples of the resin substrate include an ethylene-tetrafluoroethylene copolymer film, a substrate made of resin such as biaxially-stretched polyethylene terephthalate (PET), polyether sulfone (PES), polyether ether ketone (PEEK), polyetherimide (PEI), polyimide (PI), polyester naphthalate (PEN), or polycarbonate (PC). In particular, a substrate made of resin such as biaxially-stretched polyethylene terephthalate (PET), polyester naphthalate (PEN), or polycarbonate (PC) is preferably used in this mode.

Examples of the inorganic transparent substrate include a synthetic quartz substrate, and a glass substrate.

The thickness of the transparent substrate used in this mode may be appropriately selected depending on factors such as the intended use of the dye-sensitized solar cell module. In general, the thickness of the transparent substrate is preferably in the range of 5 μm to 2,000 μm, more preferably in the range of 10 μm to 500 μm, and even more preferably in the range of 25 μm to 200 μm.

The transparent substrate used in this mode may be in any form capable of forming the desired dye-sensitized solar cell module. In particular, the transparent substrate is more preferably a long flexible substrate wound into a roll shape. When the transparent substrate is in this form, this step and the step of forming a solid electrolyte layer on the first electrode substrate side which is carried out in the functional layer forming step described below can be performed using an R-to-R process, so that highly efficient manufacture can be achieved.

Incidentally, the flexibility of the transparent substrate may be at any level where the substrate can be wound into a roll shape and can impart desired workability to the dye-sensitized solar cell module being manufactured. Specifically, the flexibility of the transparent substrate means that the substrate bends when a force of 5 kN is applied to it in the bending test for fine ceramics according to JIS R 1601.

In addition, the transparent substrate used in this mode preferably has a high level of heat resistance, weather resistance, and barrier properties to water vapor and other gases. For example, the transparent substrate having gas-barrier properties can provide high temporal stability for the dye-sensitized solar cell in this mode. Particularly in this mode, a gas-barrier transparent substrate having an oxygen permeability of 1 cc/m$^2$/day·atm or less under the conditions of a temperature of 23° C. and a humidity of 90% and having a water-vapor permeability of 1 g/m$^2$/day or less under the conditions of a temperature of 37.8° C. and a humidity of 100% is preferably used. In this mode, to achieve such gas barrier properties, any gas-barrier layer may be provided on the transparent substrate. Incidentally, the oxygen permeability is the value measured using an oxygen gas permeability analyzer (OX-IRAN 2/20 (trade name) manufactured by MOCON, Inc). The water-vapor permeability is the value measured using a water-vapor permeability analyzer (PERMATRAN-W 3/31 (trade name) manufactured by MOCON, Inc).

(b) First Electrode Layer

When the first electrode substrate has transparency, transparent electrode layers are used as the first electrode layers as mentioned above.

The transparent electrode layers are formed in a pattern on the transparent electrode substrate. The transparent electrode layer may be of any type having a certain level of transparency enabling sunlight to be received. The transparent electrode layer may be a transparent electrode itself or a laminate of a transparent electrode and an auxiliary electrode.

(i) Transparent Electrode

The transparent electrode used in this mode may be of any type having transparency and a certain level of conductivity.

Examples of the material used to form such a transparent electrode include a metal oxide, and a conductive polymer material.

Examples of the metal oxide include $SnO_2$, $ZnO$, a compound obtained by doping tin into indium oxide (ITO), and a compound obtained by doping zinc oxide into indium oxide (IZO). In this mode, any of these metal oxides are advantageously used, and in particular, fluorine-doped $SnO_2$ (hereinafter referred to as FTO) or ITO is preferably used. FTO and ITO are excellent in both of conductivity and transparency for sunlight.

On the other hand, examples of the conductive polymer material include polythiophene, polyaniline (PA), polypyrrole, polyethylenedioxythiophene (PEDOT), and derivatives thereof. A blend of two or more of these materials may also be used.

In the invention, the transparent electrode preferably has a total light transmittance of 85% or more, more preferably 90% or more, and even more preferably 92% or more. When the transparent electrode has a total light transmittance in this range, light can be sufficiently transmitted through the transparent electrode, so that the porous layer can efficiently absorb light.

Incidentally, the total light transmittance is the value measured in the visible region using SM Color Computer (model: SM-C™) manufactured by Suga Test Instruments Co., Ltd.

In the invention, the transparent electrode preferably has a sheet resistance of 500 Ω/square or less, more preferably 300 Ω/square or less, and even more preferably 50 Ω/square or less. If the sheet resistance exceeds the range, the generated charges may fail to be sufficiently transmitted to the external circuit.

Incidentally, the sheet resistance is the value measured using a surface resistance meter manufactured by Mitsubishi Chemical Corporation (LORESTA MCP™ (four-terminal probe)) according to JIS R 1637 (resistivity test for fine ceramic thin film (four-prove measurement method)).

The transparent electrode for use in this mode may be made of a single layer or a laminate of two or more layers. Examples of a laminate of two or more layers include a laminate of layers made of materials having different work functions; and a laminate of layers made of different metal oxides.

The thickness of the transparent electrode for use in this mode is not particularly restricted as long as it is in the range where the desired conductivity can be achieved depending on factors such as the intended use of the dye-sensitized solar cell module. In general, the thickness of the transparent electrode in this mode is preferably in the range of 5 nm to 2,000 nm, and more preferably in the range of 10 nm to 1,000 nm. If the thickness exceeds the range, it may be difficult to form a uniform transparent electrode layer, or the total light transmittance may decrease so that it may be difficult to obtain good photoelectric conversion efficiency. If the thickness is below the range, the transparent electrode layer may have insufficient conductivity.

Incidentally, when the transparent electrode is composed of a plurality of layers, the thickness refers to the total thickness, namely, the sum of the thicknesses of all layers.

The transparent electrodes may be in any pattern as long as the desired dye-sensitized solar cell module can be manufactured. The transparent electrodes are preferably in a stripe pattern although the pattern can be selected as needed depending on the intended use of the dye-sensitized solar cell module, the method of connecting the first and second electrode layers in the connecting step described below, or other factors. The transparent electrodes can be easily formed in a stripe pattern. In addition, if the transparent electrodes are formed in a stripe pattern, the porous layers, the solid electrolyte layers, and other layers can be easily formed in the process after this step.

In the connecting step described below, the first and second electrode layers of adjacent dye-sensitized solar cells may be electrically connected using internal part of the dye-sensitized solar cell module. In this case, the transparent electrode is preferably patterned so as to have a connection part to the second electrode layer.

The connection part may be any part of the transparent electrode. When the transparent electrodes are in a stripe pattern, a connection part "a" containing the short-side end of the stripe as shown in FIG. 4C is preferably formed, or a connection part "a" containing the long-side end of the stripe as shown in FIG. 6A is preferably formed. In particular, the connection part "a" is preferably formed so as to contain the long-side end of the stripe. In this case, a larger contact area can be formed between the first and second electrode layers to prevent failures such as poor connection in the resulting dye-sensitized solar cell module.

Incidentally, also when the transparent electrodes are formed in any other pattern than the stripe pattern, the connection part is generally formed at an end of the patterned first electrode layer.

The method of forming the transparent electrodes may be any method capable of forming a predetermined pattern of transparent electrodes on the transparent substrate in such a manner that the transparent electrodes can be used as the plurality of first electrode layers. Examples of such a method include a method of forming the transparent electrode layers by vapor deposition such as sputtering using a metal mask; a method of forming a film of the transparent electrode layer material over the transparent substrate and etching the film in a predetermined pattern; and a method of preparing a metal paste containing the transparent electrode layer material and printing the metal paste on the transparent substrate.

(ii) Auxiliary Electrode

In this step, the transparent electrode layer may be formed as a laminate of the transparent electrode and the auxiliary electrode as mentioned above.

The auxiliary electrode may be an electrode formed in a mesh using a conductive material. When the auxiliary electrode is used in combination with the transparent electrode, a dye-sensitized solar cell module with higher power generation efficiency can be manufactured in this mode.

The auxiliary electrode may be formed in any position as long as a dye-sensitized solar cell module with higher power generation efficiency can be manufactured in this mode when it is used in combination with the transparent electrode. The auxiliary electrode may be formed on the transparent electrode, which is formed on the transparent substrate, or may be formed between the transparent substrate and the transparent electrode. In this mode, the auxiliary electrode is preferably formed between the transparent substrate and the transparent electrode. When the solid electrode layer described below contains iodide ions, any iodide ions contained in the solid electrolyte layer described below are less accessible to the auxiliary electrode than in the case that the auxiliary electrode is formed on the transparent electrode, which is formed on the transparent substrate.

The material used for the auxiliary electrode in this mode may be any material capable of raising the power generation efficiency of the dye-sensitized solar cell in this mode.

Specific examples of such a material for use in the auxiliary electrode include titanium, tungsten, molybdenum, chromium, and platinum. General metal species such as aluminum, nickel, copper, iron, silver, and alloys thereof may also be used after subjected to an anti-corrosion surface treatment.

(2) Substrate Having No Transparency

The first electrode substrate having no transparency may be any substrate not exhibiting such transparency as described in the section "(1) Substrate having transparency." In general, however, the substrate having no transparency includes a first substrate and a metal layer formed in a pattern on the first substrate.

(a) First Substrate

The first substrate may be a transparent substrate or a substrate having no transparency. The transparent substrate may be the same as that described above in the section "(1) Substrate having transparency," and therefore a description thereof will be omitted here.

The first substrate having no transparency may be a resin substrate.

Incidentally, the resin material for use in the resin substrate may be the same as for use in the transparent resin substrate described above, and therefore a description thereof will be omitted here.

The thickness, shape, and other properties of the first substrate having no transparency may also be the same as those described in the section "(1) Substrate having transparency," and therefore a description thereof will be omitted here.

(b) First Electrode Layer

When the first electrode substrate has no transparency, a metal layer is used as the first electrode layer as mentioned above.

The metal layer preferably has flexibility, although it may be of any type capable of being formed in a predetermined pattern on the first substrate. When the metal layer has flexibility, a dye-sensitized solar cell module with higher workability can be manufactured in this mode.

Specific examples of the metal used to form the metal layer include copper, aluminum, titanium, chromium, tungsten, molybdenum, platinum, tantalum, niobium, zirconium, zinc, various stainless steels, and alloys thereof. Titanium, chromium, tungsten, various stainless steels, and alloys thereof are preferred.

The metal layer may have any thickness as long as it functions as the first electrode layer of the dye-sensitized solar cell module. In general, the thickness of the metal layer is preferably in the range of 5 µm to 1,000 µm, more preferably in the range of 10 µm to 500 µm, and even more preferably in the range of 20 µm to 200 µm.

The metal layer pattern may be the same as the transparent electrode pattern described above, and therefore a description thereof will be omitted here.

The method of forming the metal layer may be the same as a common metal layer forming method.

Examples include a method of forming a metal film on the first substrate by vapor deposition or the like and then etching the metal film in a predetermined pattern; and a method of forming a metal layer in a certain pattern on the first substrate by vapor deposition using a metal mask or the like.

(3) Additional Structures

The first electrode substrate formed in this step may have any other additional structure, if necessary, as long as it includes the first substrate and the first electrode layers.

For example, when the porous layer is formed on the second electrode substrate-forming base material side in the porous layer forming step described below, a catalyst layer is preferably formed on the first electrode layer of the first electrode substrate, which is formed in this step.

The catalyst layer has the function of contributing to the improvement of the power generation efficiency of the dye-sensitized solar cell module.

Examples of such a catalyst layer include, but are not limited to, Pt vapor-deposited on the first electrode layer and catalyst layers made of polyethylenedioxythiophene (PEDOT), polypyrrole (PP), polyaniline (PA), derivatives thereof, and blends thereof.

The thickness of such a catalyst layer is preferably in the range of 5 nm to 500 nm, more preferably in the range of 10 nm to 300 nm, and even more preferably in the range of 15 nm to 100 nm.

The catalyst layer may be formed by any method capable of forming it with a desired thickness on the first electrode layer, which may be the same as a common catalyst layer forming method for dye-sensitized solar cells, and therefore, a description of the method will be omitted here.

As shown in FIGS. 4C and 4D, in this step, the catalyst layer 5 may be formed over the first electrode layer 12 entirely, or as shown in FIGS. 6C and 6D, the catalyst layer may be formed in a certain pattern on part of the first electrode layer 12.

When the catalyst layer is formed in a certain pattern, its pattern preferably corresponds to the solid electrolyte layer pattern described below. Incidentally, the solid electrolyte layer pattern will be described below, and therefore a description thereof is omitted here.

(4) First Electrode Substrate

The first electrode substrate formed in this step may be any of the substrates mentioned above; the substrate having transparency and the substrate having no transparency. However, the substrate having transparency is preferred.

In the porous layer forming step described below, the porous layer is formed either on the first electrode layer of the first electrode substrate or on the second electrode layer of the second electrode substrate-forming base material described below. If the porous layer is formed on the second electrode layer, the porous layer can be continuously formed, so that the manufacturing method in this mode can be more simplified.

The porous layer forming method preferably includes forming a porous layer through firing on a metal layer used as the second electrode layer.

In this case, a substrate having no transparency is preferably used as the second electrode substrate, and therefore the first electrode substrate formed in this step is preferably a substrate having transparency.

2. Second Electrode Substrate Preparing Step

In this mode, the second electrode substrate preparing step is a step of preparing a single second electrode substrate-forming base material having the second electrode layer and capable of being cut into the plurality of second electrode substrates.

The second electrode substrate-forming base material may be a base material having transparency or no transparency, which may be appropriately selected depending on which side is used as the light receiving surface for the dye-sensitized solar cell module manufactured by the method in this mode.

When the first electrode substrate formed in the first electrode substrate forming step has transparency, the second electrode substrate-forming base material may be a base material having transparency or no transparency. On the other hand, when the first electrode substrate has no transparency, a base material having transparency is used as the second electrode substrate-forming base material.

Such a second electrode substrate-forming base material is not restricted as long as it can function as an electrode and can form each second electrode substrate when cut into pieces of a desired shape in the cutting step described below. It may be made of a second electrode layer or may include a second electrode layer and a second substrate for supporting the second electrode layer.

The second electrode substrate-forming base material may be made of a second electrode layer. In this case, for example, a single metal layer, specifically, a metal base material is used as the second electrode substrate-forming base material.

The metal base material is preferably a long flexible material wound into a roll shape, although it may be in any form as long as it can form the desired second electrode substrates.

Incidentally, the flexibility of the metal base material means that the material bends when a force of 5 kN is applied to the material in the metal material bending test according to JIS Z 2248.

The metal used to form the metal base material may be the same as that of the metal layer used to form the first electrode substrate described above, and therefore a description thereof will be omitted here.

The metal base material may have any thickness as long as it can be cut in the cutting step described below. The thickness of the metal base material may be the same as the thickness of the metal layer used to form the first electrode substrate described above.

On the other hand, the second electrode substrate-forming base material may include a second electrode layer and a second substrate. In this case, the transparent electrode layer or the metal layer described above in the section on the first electrode substrate forming step may be used as the second electrode layer, and the transparent substrate or the resin substrate described above in the section on the first electrode substrate forming step may be used as the second substrate.

Incidentally, in the second electrode substrate-forming base material, the second electrode is generally formed over the second substrate entirely.

The transparent substrate, the resin substrate, the transparent electrode layer, and the metal layer may be the same as those described in the section on the first electrode substrate forming step, and therefore a description of thereof will be omitted here.

The second electrode substrate-forming base material prepared in this step may have any other optional structure.

For example, when the porous layer is formed on the first electrode layer of the first electrode substrate described above in the porous layer forming step described below, a catalyst layer is preferably formed on the second electrode layer.

Incidentally, this catalyst layer may be the same as described in the section on the first electrode substrate forming step, and therefore a description thereof will be omitted here.

The second electrode substrate-forming base material prepared in this step is more preferably made of the second electrode layer itself, namely, it is more preferably a metal base material. This is because as described above in the section on the first electrode substrate forming step, the porous layer should preferably be formed on the second electrode layer of the second electrode substrate-forming base material in the porous layer forming step described below.

3. Porous Layer Forming Step

In this mode, the porous layer forming step is a step of forming a porous layer either on each of the plurality of first electrode layers or on the second electrode layer, in which the porous layer contains sensitizing dye-bearing fine particles of metal oxide semiconductor.

Hereinafter, the porous layer formed in this step and the porous layer forming method will be described.

(1) Porous Layer

The porous layer contains sensitizing dye-bearing fine particles of metal oxide semiconductor. Hereinafter, the fine particles of metal oxide semiconductor and the sensitizing dye for use in the porous layer will be described, respectively.

(a) Fine Particles of Metal Oxide Semiconductor

The fine particles of metal oxide semiconductor may be of any type as long as they include a metal oxide having semiconducting properties. Examples of the metal oxide used to form the fine particles of metal oxide semiconductor include $TiO_2$, $ZnO$, $SnO_2$, $ITO$, $ZrO_2$, $MgO$, $Al_2O_3$, $CeO_2$, $Bi_2O_3$, $Mn_3O_4$, $Y_2O_3$, $WO_3$, $Ta_2O_5$, $Nb_2O_5$, and $La_2O_3$.

Especially in this mode, fine particles of $TiO_2$ metal oxide semiconductor are most preferably used. This is because $TiO_2$ has particularly good semiconducting properties.

In general, the fine particles of metal oxide semiconductor preferably have an average particle size in the range of 1 nm to 10 μm, and more preferably in the range of 10 nm to 1,000 nm.

Incidentally, the average particle size of the fine particles of metal oxide semiconductor means the primary particle size.

(b) Sensitizing Dye

The sensitizing dye may be of any type capable of absorbing light to induce an electromotive force. Such a sensitizing dye may be an organic dye or a metal complex dye. Examples of the organic dye include acridine dyes, azo dyes, indigo dyes, quinone dyes, coumarin dyes, merocyanine dyes, phenylxanthene dyes, indoline dyes, and carbazole dyes. Among these organic dyes, coumarin dyes are preferably used in the invention. A ruthenium-based dye is preferably used as the metal complex dye, and in particular, ruthenium complexes, specifically, a ruthenium bipyridine dye and a ruthenium terpyridine dye, are preferably used. Such ruthenium complexes have a wide light-absorption range and thus can significantly widen the light wavelength region where photoelectric conversion is possible.

(c) Optional Components

The porous layer may contain an optional component other than the fine particles of metal oxide semiconductor. For example, a resin may be used as an optional component in this step. The addition of a resin to the porous layer can reduce the brittleness of the porous layer formed in this step.

Examples of the resin that may be used in this step to form the porous layer include polyvinylpyrrolidone, ethyl cellulose, and caprolactone.

(d) Porous Layer

The thickness of the porous layer formed in this step is not restricted and may be appropriately selected depending on the intended use of the dye-sensitized solar cell module manufactured by the method in this mode. In general, the thickness of the porous layer in the invention is preferably in the range of 1 μm to 100 μm, and more preferably in the range of 3 μm to 30 μm.

In this step, the porous layer is formed either on each of a plurality of first electrode layers of the first electrode substrate or on the second electrode layer of the second electrode substrate-forming base material.

When the porous layer is formed on the second electrode layer of the second electrode substrate-forming base material, the porous layer may be formed over the second electrode layer entirely or may be formed in such a manner that part of the second electrode layer is exposed without being covered with the porous layer.

In the connecting step described below, parts of the first and second electrode layers of adjacent dye-sensitized solar cells may be brought into direct contact with each other and connected to each other. In this case, the porous layer is preferably not present on the connection parts of the first and second electrode layers.

In this case, therefore, it is preferred that as shown in FIGS. 6A and 7A, the porous layer should be continuously formed on a part other than the connection part b' of the second electrode substrate-forming base material 20'.

On the other hand, the porous layer may be formed on each of a plurality of first electrode layers of the first electrode substrate. In this case, the porous layers are generally formed in a pattern corresponding to the pattern of the first electrode layers.

In this mode, the expression "the porous layers are formed in a pattern corresponding to the pattern of the first electrode layers" means that each porous layer is formed on each patterned first electrode layer in such a manner that the porous layer is contained in each organic solar cell constituting the organic solar cell module manufactured by the method of the invention. More specifically, the expression means that one porous layer is formed in a continuously formable pattern on one first electrode layer.

The porous layer may be formed in any mode as long as it is formed on each first electrode layer of the first electrode substrate. The porous layer may be formed entirely over each first electrode layer, or may be formed in such a manner that part of each first electrode layer is exposed without being covered with the porous layer.

Figure 8:
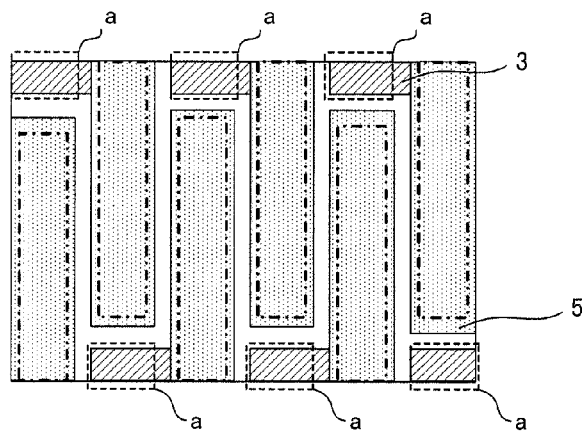
FIG. 8 is a schematic plan view showing an example of the first electrode substrate formed in the method of the invention for manufacturing an organic solar cell module.

In the connecting step described below, the first and second electrode layers of adjacent dye-sensitized solar cells may be electrically connected to each other using internal part of the dye-sensitized solar cell module. In this case, the porous layer is preferably not present on the connection parts of the first and second electrode layers. As shown in FIG. 8, therefore, the porous layer 4 is preferably not formed on the connection part "a" of each first electrode layer 12.

As shown in FIG. 8, the porous layer 4 formed on the first electrode layer 12 preferably has a width larger than the width of the first electrode layer 12. This successfully prevents an internal short caused by accidental contact between the first and second electrode layers in a single dye-sensitized solar cell of the dye-sensitized solar cell module manufactured according to this mode.

Incidentally, FIG. 8 is a top view showing an example of the first electrode substrate on which porous layers are formed on its first electrode layer side in this step. In FIG. 8, the first electrode layer is formed in each region indicated by the dot and dash line.

(2) Porous Layer Forming Method

In this step, any method may be used to form the porous layer as long as it can form the porous layer with a desired thickness on each of the plurality of first electrode layers of the first electrode substrate or on the second electrode layer of the second electrode substrate.

Incidentally, this step is more preferably performed using an R-to-R process when the first substrate or the second electrode substrate-forming base material has a long shape and is wound into a roll shape as mentioned above. In this case, the dye-sensitized solar cell module can be manufactured with higher efficiency.

Thus, the method used in this step to form the porous layer is preferably applicable to the R-to-R process.

In this step, the porous layer is preferably formed on the second electrode layer of the second electrode substrate-forming base material. In this case, the porous layer can be continuously formed, so that the method of forming the porous layer can be simpler than that used to form the porous layer in a certain pattern on each first electrode layer of the first electrode substrate.

More specifically, the porous layer may be formed by the following method.

First, a porous layer-forming coating liquid is prepared, which includes at least the fine particles of metal oxide semiconductor mentioned above, a binder resin, and a solvent. Subsequently, a metal layer is used as the second electrode layer, and the porous layer-forming coating liquid prepared is applied with a desired thickness to the metal layer so that a porous layer-forming coating is formed. The porous layer-forming coating is fired so that the binder resin is thermally decomposed and a porous layer-forming film is formed. A sensitizing dye is then deposited on the surface of the porous layer-forming film, so that a porous layer is formed.

The binder resin and the solvent used in the porous layer-forming coating liquid may be the same as those used in common porous layer-forming methods, and therefore, a description of such materials will be omitted here. Besides the components mentioned above, if necessary, a dispersing agent may also be added to the porous layer-forming coating liquid.

The method of applying the porous layer-forming coating liquid, the firing conditions, and others may also be the same as those used in common porous layer-forming methods, and therefore a description thereof will be omitted here.

Alternatively, the porous layer may be formed using the following method.

First, a porous layer-forming composition containing the above-mentioned fine particles of metal oxide semiconductor and a solvent is applied to the second electrode layer and dried to form a porous layer-forming film. A sensitizing dye is then deposited on the porous layer-forming film, so that a porous layer is formed. The solvent used in the porous layer-forming composition, the method of applying the porous layer-forming composition, the drying conditions, and others may be the same as those used in common porous layer-forming methods, and therefore, a description thereof will be omitted here.

This method may also be used in the case that the porous layer is formed on each of the first electrode layers of the first electrode substrate.

Alternatively, the porous layer may also be formed using the following method.

A release layer is formed on a heat-resistant substrate using the same method as used when the porous layer is formed through firing on the second electrode layer. Subsequently, the porous layer is placed on the release layer and bonded to the second electrode layer. The heat-resistant substrate is then removed, so that the porous layer is obtained.

This method may also be used in the case that the porous layer is formed on each of the first electrode layers of the first electrode substrate.

4. Functional Layer Forming Step

In this mode, the functional layer forming step includes either forming solid electrolyte layers on the first electrode layer side of the first electrode substrate, in which the solid electrolyte layers contain a polymer compound and a redox couple and are formed in a pattern corresponding to the pattern of the first electrode layers, or continuously forming the solid electrolyte layer on the second electrode layer side of the second electrode substrate-forming base material.

Incidentally, in this mode, the expression "the solid electrolyte layers are formed in a pattern corresponding to the pattern of the first electrode layers" means that each solid electrolyte layer is formed on each patterned first electrode layer in such a manner that the solid electrolyte layer is contained in each organic solar cell constituting the organic solar cell module manufactured by the method of the invention. More specifically, the expression means that one solid electrolyte layer is formed in a continuously formable pattern on one first electrode layer.

The solid electrolyte layer formed in this step contains a polymer compound and a redox couple, and is not fluid. Incidentally, as used herein, the term "solid electrolyte layer" is intended to also include a gel electrolyte layer.

(1) Materials for Solid Electrolyte Layer

In this mode, the materials for the solid electrolyte layer include a polymer compound and a redox couple.

(a) Polymer Compound

The polymer compound for use in the solid electrolyte layer will be described.

Examples of the polymer compound, which are preferably used in the solid electrolyte layer, include polymer compounds whose main chain is polyether, polymethacrylic acid, poly(alkyl acrylate), poly(alkyl methacrylate), polycaprolactone, polyhexamethylene carbonate, polysiloxane, polyethylene oxide, polypropylene oxide, polyacrylonitrile, polyvinylidene fluoride, polyvinyl fluoride, polyhexafluoropropylene, polyfluoroethylene, polyethylene, polypropylene, polystyrene, or polyacrylonitrile, or copolymers of two or more of these monomer components.

The polymer compound for use in the solid electrolyte layer may also be a cellulosic resin. Since a cellulosic resin has high heat resistance, an electrolyte layer solidified with a cellulosic resin does not cause fluid leakage even at high temperature and has high thermal stability. Examples of such a cellulosic resin include cellulose, cellulose esters such as cellulose acetates (CA) such as cellulose acetate, cellulose diacetate, and cellulose triacetate, cellulose acetate butyrate (CAB), cellulose acetate propionate (CAP), cellulose acetate phthalate, and cellulose nitrate; and cellulose ethers such as methyl cellulose, ethyl cellulose, benzyl cellulose, cyanoethyl cellulose, hydroxymethyl cellulose, hydroxyethyl cellulose, hydroxypropyl cellulose, hydroxypropyl methylcellulose, and carboxymethyl cellulose. Any of these cellulosic resins may be used alone or in combination of two or more.

Among the cellulosic resins, the use of a cationic cellulose derivative is particularly preferred in view of its compatibility with an electrolytic solution. A cationic cellulose derivative refers to a cationic product obtained by allowing a cationization agent to react with the OH groups of cellulose or a derivative thereof. When a cationic cellulose derivative is added, the resulting solid electrolyte layer can have high thermal stability and high electrolytic-solution-retaining properties so that electrolytic solution leakage can be prevented particularly at high temperature or during pressurization.

The molecular weight of the cellulosic resin varies with the type of the cellulosic resin and is not restricted. In order to obtain good film-forming ability in the process of forming the electrolyte layer, the cellulosic resin preferably has a weight average molecular weight of 10,000 or more (polystyrene-equivalent molecular weight), and more preferably in the range of 100,000 to 200,000. For example, when ethyl cellulose is used as the cellulosic resin, its molecular weight is preferably such that a solution of 2% by weight ethyl cellulose in water has a viscosity in the range of 5 mPa·s to 1,000 mPa·s, and particularly in the range of 10 mPa·s to 500 mPa·s, as measured at 30° C.

The cellulosic resin also preferably has a glass transition temperature in the range of 80° C. to 150° C. in order to form an electrolyte layer with sufficient thermal stability.

The polymer compound for use in the invention preferably has transparency. The polymer compound having transparency can increase the transparency of the solid electrolyte layer. In addition, when the solid electrolyte layer has higher transparency, the dye-sensitized solar cell module manufactured by the method in this mode can have a good appearance. In addition, if the solid electrolyte layer infiltrates into the porous layer, the solid electrolyte layer can be prevented from blocking light, so that a dye-sensitized solar cell module with higher performance can be manufactured according to this mode.

The content of such a polymer compound should be appropriately determined taking into account that if the content is too low, the solid electrolyte layer can have lower thermal stability, and if the content is too high, the solar cell can have lower photoelectric conversion efficiency. Specifically, the content of the polymer compound in the materials constituting the solid electrolyte layer is preferably from 5% by weight to 60% by weight. If the content of the polymer compound in the materials constituting the solid electrolyte layer is below the range, the solid electrolyte layer may have insufficient adhesion to the porous layer described below, and it may lead to a reduction in the mechanical strength of the solid electrolyte layer itself, which is not preferred. On the other hand, if the content exceeds the range, the high content of such an insulating polymer compound may interfere with the charge transporting function, which is not preferred.

(b) Redox Couple

Next, the redox couple for use in the solid electrolyte layer will be described.

In the solid electrolyte layer formed by this step, the redox couple may be of any type commonly used in electrolyte layers of dye-sensitized solar cells. Specifically, the redox couple is preferably a combination of iodine and an iodide or a combination of bromine and a bromide. For example, a combination of iodine and an iodide may be a combination of $I_2$ and a metal iodide such as LiI, NaI, KI, or $CaI_2$. A combination of bromine and a bromide may be a combination of $Br_2$ and a metal bromide such as LiBr, NaBr, KBr, or $CaBr_2$.

The content of the redox couple in the solid electrolyte layer is preferably in the range of 1% by weight to 50% by weight, and more preferably in the range of 5% by weight to 35% by weight.

(c) Additional Components

Besides the polymer compound and the redox couple, if necessary, an additional component may be appropriately added to the solid electrolyte layer for use in the invention. For example, such a component may be an ionic liquid.

(2) Solid Electrolyte Layer

The solid electrolyte layer formed by this step preferably has a thickness in the range of 10 nm to 100 µm, more preferably in the range of 1 µm to 50 µm, and even more preferably in the range of 5 µm to 30 µm. The solid electrolyte layer with a thickness below the range may fail to function satisfactorily, so that the dye-sensitized solar cell module may have lower power generation efficiency. If the thickness of the solid electrolyte layer exceeds the range, it may be difficult to manufacture the dye-sensitized solar cell module in the form of a thin film by the method in this mode.

When the solid electrolyte layers are formed on the first electrode substrate side, the solid electrolyte layers may be in any pattern corresponding to the pattern of the first electrode layers. More preferably, the solid electrolyte layers are formed in the same pattern as that of the porous layers formed on the first electrode layers in the porous layer forming step.

When the porous layer is formed on the first electrode layer, the solid electrolyte layer is usually formed entirely over the porous layer.

In the process of forming the solid electrolyte layer on the second electrode substrate-forming base material, usually, the solid electrolyte layer is continuously formed. The solid electrolyte layer may be formed over the second electrode layer entirely, or may be formed in such a manner that part of the second electrode layer is exposed without being covered with the solid electrolyte layer.

Specifically, the shape of the solid electrolyte layer may be the same as the shape of the porous layer formed on the second electrode layer in the porous layer forming step.

When the porous layer is formed on the second electrode layer, the solid electrolyte layer is usually formed over the porous layer entirely.

(3) Solid Electrolyte Layer Forming Method

In this step, solid electrolyte layers may be formed in a pattern on the first electrode layer side of the first electrode substrate. In this case, the solid electrolyte layers may be formed using any known method capable of forming a desired pattern of solid electrolyte layers with a desired thickness on the first electrode layers.

This step is more preferably performed using an R-to-R process when the first substrate used to form the first electrode substrate has a long shape and is wound into a roll shape as mentioned above. In this case, the dye-sensitized solar cell module can be manufactured with higher efficiency.

Alternatively, in this step, the solid electrolyte layer may be continuously formed on the second electrode substrate side of the second electrode substrate-forming base material. Also in this case, the solid electrolyte layer may be formed using any known coating method capable of forming a solid electrolyte layer with a desired thickness.

This step is also more preferably performed using an R-to-R process when the second electrode substrate-forming base material has a long shape and is wound into a roll shape as mentioned above. In this case, the dye-sensitized solar cell module can be manufactured with higher efficiency.

5. Cutting Step

In this mode, the cutting step includes cutting the second electrode substrate-forming base material to form the plurality of second electrode substrates.

The second electrode substrates formed by this step may have any shape as long as adjacent second electrode substrates are not in contact with each other in the dye-sensitized solar cell module manufactured according to this mode. The shape of the second electrode substrate may be appropriately selected and determined depending on the intended use or other factors of the dye-sensitized solar cell module.

In the connecting step described below, the first and second electrode layers of adjacent dye-sensitized solar cells may be electrically connected to each other using internal part of the dye-sensitized solar cell module. In this case, the second electrode substrate formed in this step is preferably in such a shape that the second electrode layer has a connection part to the first electrode layer.

The connection part may be in any form as long as it is formed as part of the second electrode layer of the second electrode substrate. When the second electrode substrate has a strip shape, it is preferred to form a connection part "b" containing the short-side end of the strip as shown in FIG. 6E or to form a connection part "b" containing a long-side end of the strip as shown in FIG. 7E, and it is particularly preferred to form a connection part "b" containing a long-side end of the strip. In this case, a larger contact area can be formed between the first and second electrode layers to prevent failures such as poor connection in the resulting dye-sensitized solar cell module.

Incidentally, even when the second electrode substrate has any other shape than the strip shape, the connection part to the first electrode layer is usually formed at an end of the second electrode layer of the second electrode substrate.

When the porous layer and/or the solid electrolyte layer is formed on the second electrode substrate-forming base material, the second electrode substrate-forming base material is usually cut in such a manner that the porous layers and/or the solid electrolyte layers provided respectively on the second electrode substrates formed by this step have a pattern corresponding to the pattern of the first electrode layers.

In this step, the second electrode substrate-forming base material may be cut using any known method capable of cutting the second electrode substrate-forming base material into second electrode substrates with a desired shape.

6. Boding Step

In this mode, the bonding step is a step of opposing and bonding the first electrode layer side of the first electrode substrate and the second electrode layer side of the second electrode substrate to each other with the solid electrolyte layer interposed therebetween so that the first electrode substrate and the second electrode substrate are bonded together.

In this step, when the porous layer is formed on each of the plurality of first electrode layers of the first electrode substrate, the porous layer and the second electrode layer are opposed and bonded to each other with the solid electrolyte layer interposed therebetween. On the other hand, when the porous layer is formed on the second electrode layer of the second electrode substrate, the first electrode layer and the porous layer are opposed and bonded to each other with the solid electrolyte layer interposed therebetween.

When the catalyst layer is formed on the electrode layer on the side where no porous layer is formed, the porous layer and the catalyst layer are opposed and bonded to each other with the solid electrolyte layer interposed therebetween.

Now, this step will be described with reference to the drawings.

In this step, for example, the catalyst layer 5 formed on each of the plurality of first electrode layers 12 of the first electrode substrate 10 shown in FIG. 4D is opposed and bonded to the porous layer 3 formed on the second electrode layer of each of a plurality of second electrode substrates shown in FIG. 6E with the solid electrolyte layer 4 interposed therebetween. In this step, therefore, the structure of the dye-sensitized solar cell module 100 shown in FIGS. 1A and 1B can be obtained.

Alternatively, in this step, for example, the catalyst layer 5 formed on each of the first electrode layers 12 of the first electrode substrate 10 shown in FIG. 5D is opposed and bonded to the porous layer 3 formed on the second electrode layer of each of a plurality of second electrode substrates shown in FIG. 7E with the solid electrolyte layer 4 interposed therebetween. In this step, therefore, the structure of the dye-sensitized solar cell module 100 shown in FIGS. 3A and 3B can be obtained.

This step may be performed using any bonding method capable of successfully bonding the first electrode layer and the porous layer with the solid electrolyte layer being placed at the interface. Roll lamination or vacuum lamination is preferably used in this step. With these methods, it is easy to prevent air from entering the bonding interface during the bonding.

7. Connecting Step

In this mode, the connecting step is a step of electrically connecting the first electrode layer of one of the dye-sensitized solar cells to the second electrode layer of another dye-sensitized solar cell which is adjacent to the one dye-sensitized solar cell.

In this step, the first and second electrode layers may be connected using any method capable of electrically connecting the first and second electrode layers of adjacent dye-sensitized solar cells in the dye-sensitized solar cell module. Examples include a method of electrically connecting the first and second electrode layers using internal part of the dye-sensitized solar cell module, such as a method of bringing the first and second electrode layers of adjacent dye-sensitized solar cells into direct contact with each other or a method of forming a conductive layer between the first and second electrode layers to connect them; and a method of electrically connecting the first and second electrode layers of adjacent dye-sensitized solar cells to each other using external means, such as a conducting wire.

In this step, it is more preferred to use a method of electrically connecting the first and second electrode layers of adjacent dye-sensitized solar cells using internal part of the dye-sensitized solar cell module. This method is simpler than the electrically connecting method using means external to the dye-sensitized solar cell module.

In this step, it is also preferred to use a method of forming a conductive layer between the first and second electrode layers of adjacent dye-sensitized solar cells to connect them. This method can more successfully prevent poor connection in the dye-sensitized solar cell module manufactured according to this mode.

Incidentally, the conductive layer may be formed using a common conductive adhesive or other conductive materials.

When the first and second electrode layers of adjacent dye-sensitized solar cells are electrically connected to each other using internal part of the dye-sensitized solar cell module, the first and second electrode layers each preferably have a connection part as mentioned above.

The connection method using the connection parts will be more specifically described with reference to the drawings.

In this step, for example, when the catalyst layer 5 formed on each of the plurality of first electrode layers 12 of the first electrode substrate 10 shown in FIG. 4D is opposed and bonded to the porous layer 3 formed on the second electrode layer 22 of each of a plurality of second electrode substrates 20 shown in FIG. 6E with the solid electrolyte layer 4 interposed therebetween, the connection part "a" containing the short-side end of each stripe of the first electrode layer 12 is brought into direct contact with the connection part "b" containing the short-side end of the strip of the second electrode layer 22, so that as shown in FIG. 1A, the first and second electrode layers 11 and 22 of adjacent dye-sensitized solar cells are electrically connected to each other.

Alternatively, in this step, for example, when the catalyst layer 5 formed on each of the first electrode layers 12 of the first electrode substrate 10 shown in FIG. 5D is opposed and bonded to the porous layer 3 formed on the second electrode layer 22 of each of a plurality of second electrode substrates 20 shown in FIG. 7E with the solid electrolyte layer 4 interposed therebetween, the connection part "a" containing the long-side end of each stripe of the first electrode layer 12 is brought into direct contact with the connection part "b" containing the long-side end of the strip of the second electrode layer 22, so that as shown in FIGS. 3A and 38, the first and second electrode layers 11 and 22 of adjacent dye-sensitized solar cells are electrically connected to each other.

Figure 3B:
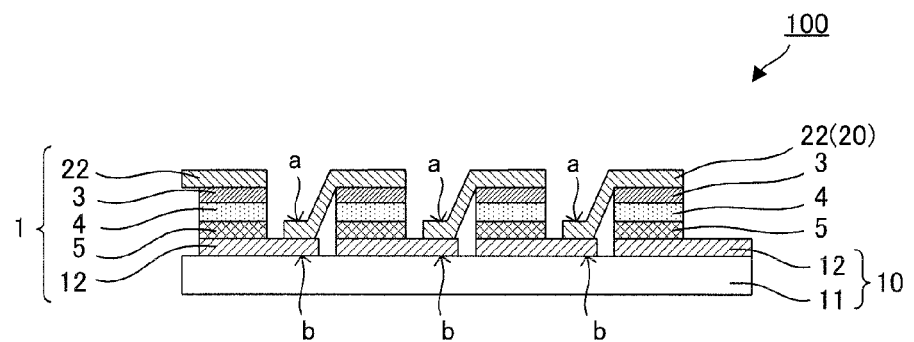

Incidentally, as shown in FIGS. 3A and 3B, this step is more preferably performed using the connection part "a" containing the long-side end of each stripe of the first electrode layer 12 and the connection part "b" containing the long-side end of the strip of the second electrode layer 22. In this case, a larger connection area can be provided between the first and second electrode layers 12 and 22, so that poor connection can be prevented more successfully.

8. Additional Steps

If necessary, any other steps may be selected and added to the method for manufacturing the dye-sensitized solar cell module in this mode, as long as the manufacturing method includes the steps each described above.

For example, such an optional step, which is performed after the manufacture of the dye-sensitized solar cell module, includes placing a transparent resin film or a metal laminate film on the first and second substrates of the dye-sensitized solar cell module to package the module.

For example, another optional step includes forming a larger dye-sensitized solar cell module by making a plurality of dye-sensitized solar cell modules through each step described above and combining the plurality of dye-sensitized solar cell modules.

II. Second Mode

A second mode of the method of the invention for manufacturing an organic solar cell module is a method for manufacturing an organic thin-film solar cell module comprising a plurality of connected organic thin-film solar cells each having a photoelectric conversion layer between the first and second electrode layers, wherein the functional layer is an organic material-containing layer formed between the first and second electrode layers.

In the following description, the organic solar cell module will be referred to as the organic thin-film solar cell module.

In the organic thin-film solar cell module manufactured by the method in this mode, either the first electrode layer or the second electrode layer is used as an electrode for extracting holes generated in the photoelectric conversion layer (hole extraction electrode), and the other is used as an electrode for extracting electrons generated in the photoelectric conversion layer (electron extraction electrode).

Figure 9A:
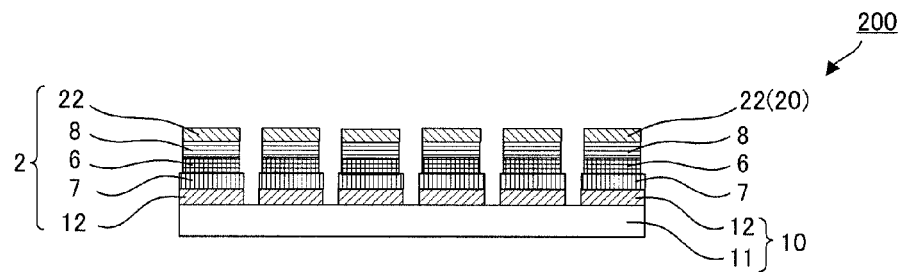
FIGS. 9A and 9B are each a schematic cross-sectional views showing an example of an organic thin-film solar cell module manufactured by the method of the invention for manufacturing an organic solar cell module.
Figure 9B:
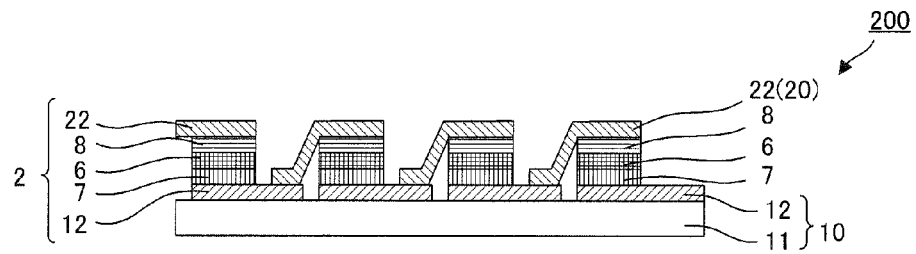

Now, the organic thin-film solar cell module manufactured by the method in this mode will be described with reference to the drawings. FIGS. 9A and 9B are schematic cross-sectional views showing an example of an organic thin-film solar cell module manufactured by the method in this mode. Incidentally, a schematic plan view of FIG. 9A is similar to the schematic plan view of the dye-sensitized solar cell module shown in FIG. 1A, and a schematic plan view of FIG. 9B is similar to the schematic plan view of the dye-sensitized solar cell module shown in FIG. 3A. Therefore, a description thereof will be omitted here.

As shown in FIGS. 9A and 9B, the organic thin-film solar cell module 200 manufactured by the method in this mode comprises a first electrode substrate 10 having a single first substrate 11 and a plurality of first electrode layers 12 formed in a pattern on the first substrate 11; a plurality of second electrode substrates 20 each having at least a second electrode layer 22; and a photoelectric conversion layer 6 formed between each first electrode layer 12 of the first electrode substrate 10 and each second electrode layer 22.

In the organic thin-film solar cell module 2, a hole extraction layer is preferably formed on either the first electrode layer or the second electrode layer, and an electron extraction layer is preferably formed on the electrode layer where no hole extraction layer is formed. FIGS. 9A and 9B show examples where a hole extraction layer 7 is formed on each first electrode layer 12 and an electron extraction layer 8 is formed on each second electrode layer 22.

The organic thin-film solar cell module 200 includes a plurality of connected organic thin-film solar cells 2 each having the first electrode layer 12, the hole extraction layer 7, the photoelectric conversion layer 6, the electron extraction layer 8, and the second electrode layer 22.

In the organic thin-film solar cell module manufactured according to this mode, the functional layer may be of any type, as long as it is an organic material-containing layer formed between the first and second electrode layers and can successfully bond the first and second electrode substrates together with it interposed therebetween.

Specifically, the functional layer may be a photoelectric conversion layer or a hole extraction layer composed mainly of polyethylenedioxythiophene-polystyrene sulfonic acid (PEDOT/PSS).

More specifically, the method for manufacturing the organic thin-film solar cell module in this mode comprises steps of: a first electrode substrate forming step of forming the plurality of first electrode layers on the first substrate to form the first electrode substrate; a second electrode substrate-forming base material preparing step of preparing a single piece of second electrode substrate-forming base material having at least the second electrode layer and capable of being cut into the plurality of second electrode substrates; a functional layer forming step of either forming functional layers on the first electrode layer side of the first electrode substrate, in which the functional layers are formed in a pattern corresponding to the pattern of the first electrode layers, or continuously forming a functional layer on the second electrode layer side of the second electrode substrate-forming base material; a cutting step of cutting the second electrode substrate-forming base material to form the plurality of second electrode substrates; a bonding step of opposing and bonding the first electrode layer side of the first electrode substrate and the second electrode layer side of the second electrode substrate to each other with the functional layer interposed therebetween so that the first and second electrode substrates are bonded together; and a connecting step of electrically connecting the first electrode layer of one of the organic thin-film solar cells to the second electrode layer of another organic thin-film solar cell which is adjacent to the one organic thin-film solar cell.

The organic thin-film solar cell module has a photoelectric conversion layer as an essential component. Thus, the method for manufacturing the organic thin-film solar cell module in this mode may further comprise a step of forming a photoelectric conversion layer on the surface of either the first electrode layer or the second electrode layer, if the photoelectric conversion layer is not formed in the functional layer forming step.

Now, the method for manufacturing the organic thin-film solar cell module in this mode will be described with reference to the drawings. FIGS. 10A to 10D and FIGS. 11A to 11E are process drawings showing an example of the method for manufacturing the organic thin-film solar cell module in this mode, which illustrate an example of the manufacture of the organic thin-film solar cell module shown in FIG. 9A.

Figure 10A:
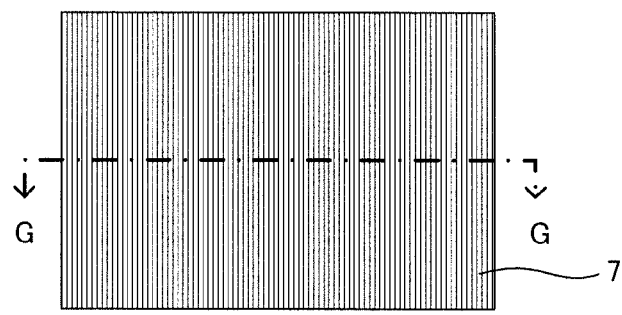
FIGS. 10A to 10D are a process drawing showing another example of the first electrode substrate forming step in the method of the invention for manufacturing an organic solar cell module.
Figure 10B:
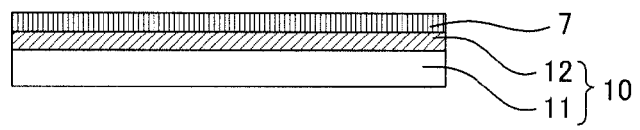

The first electrode substrate forming step in this mode will be first described. As shown in FIGS. 10A and 10B, the first electrode substrate forming step includes continuously forming a first electrode layer 12 on a first substrate 11. In the first electrode substrate forming step, either a hole extraction layer or an electron extraction layer may be formed depending on the intended use of the first electrode layer. Incidentally, FIGS. 10A and 10B show an example where a hole extraction layer 7 is formed. In this case, the hole extraction layer 7 is continuously formed or deposited on the first electrode layer 12. FIG. 10A is a top view showing an example of the first substrate 11 on which the hole extraction layer 7 is continuously formed, and FIG. 10B is a cross-sectional view along the line G-G in FIG. 10A.

Figure 10C:
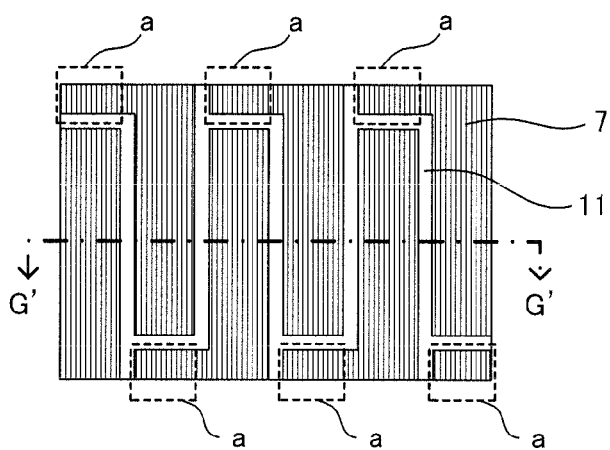
Figure 10D:
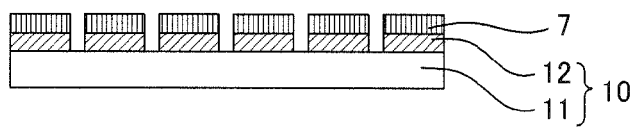

As shown in FIGS. 10C and 10D, the first electrode layer 12 and the hole extraction layer 7 are patterned into a predetermined pattern by etching or other processes, so that a first electrode substrate 10 is formed, which includes a single first substrate 11 and a plurality of first electrode layers 12 and hole extraction layers 7 formed in a pattern on the first substrate 11. FIG. 10C shows an example where the first electrode layers 12 and the hole extraction layers 7 are formed in a stripe pattern, and each first electrode layer 12 and each hole extraction layer 7 are so formed as to have a connection part "a" containing the short-side end of the stripe.

FIG. 10C is a top view showing an example of the first electrode substrate 10 formed by the first electrode substrate forming step, and FIG. 10D is a cross-sectional view along the line G'-G' in FIG. 10C.

Figure 11A:
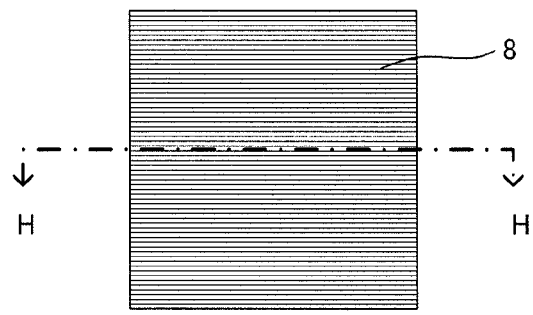
FIGS. 11A to 11E are a process drawing showing another example of the second electrode substrate-forming base material preparing step, functional layer forming step, and cutting step in the method of the invention for manufacturing an organic solar cell module.
Figure 11B:
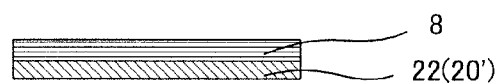

Next, the second electrode substrate-forming base material preparing step in this mode will be described. As shown in FIGS. 11A and 11B, the second electrode substrate-forming base material preparing step includes preparing a second electrode substrate-forming base material 20' having a second electrode layer 22. In the prepared second electrode substrate-forming base material 20', a hole extraction layer or an electron extraction layer may be formed on the second electrode layer 22, depending on the intended use of the second electrode layer 22. FIGS. 11A and 11B show an example where an electron extraction layer 8 is formed.

FIG. 11A is a top view showing an example of the second electrode substrate-forming base material 20' on which the electron extraction layer 8 is formed, and FIG. 11B is a cross-sectional view along the line H-H in FIG. 11A.

Next, the functional layer forming step in this mode will be described.

Figure 11C:
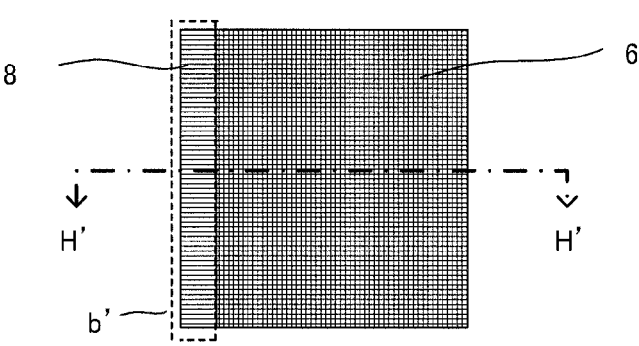
Figure 11D:
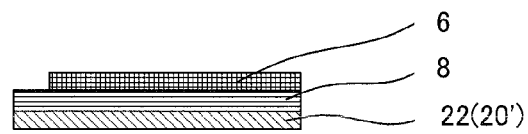

As shown in FIGS. 11C and 11D, the functional layer forming step includes continuously forming a photoelectric conversion layer 6 on the electron extraction layer 8 of the second electrode substrate-forming base material 20'. In the connection step described below, the first and second electrode layers of adjacent organic thin-film solar cells may be electrically connected using internal part of the organic thin-film solar cell module. In this case, it is preferred that as shown in FIG. 11C, the photoelectric conversion layer 6 should be continuously formed on a part other than the connection part b' of the second electrode substrate-forming base material 20'.

FIG. 11C is a top view showing an example of the second electrode substrate-forming base material 20' on which the photoelectric conversion layer 6 is formed, and FIG. 11D is a cross-sectional view along the line H'-H' in FIG. 11C.

Although not shown, the photoelectric conversion layers may be formed in a pattern on the first electrode layer side of the first electrode substrate in the functional layer forming step.

Next, the cutting step in this mode will be described.

Figure 11E:
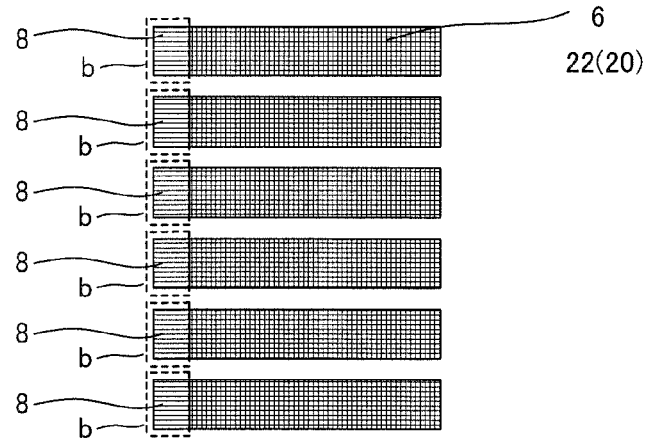

As shown in FIG. 11E, the cutting step includes cutting the second electrode substrate-forming base material 20' into pieces of a desired size to form second electrode substrates 20. FIG. 11E shows an example where the second electrode substrates 20 are formed in such a manner that adjacent second electrode substrates 20 are not in contact with each other in the resulting organic thin-film solar cell module.

Next, the bonding step and the connecting step in this mode will be described. Although not shown, in the bonding step, the hole extraction layer formed on the first electrode substrate is opposed and bonded to the electron extraction layer formed on the second electrode substrate with the photoelectric conversion layer interposed therebetween, so that the first and second electrode substrates are bonded together. In the bonding step, the first and second electrode substrates may be bonded together in such a manner that parts of the first and second electrode layers of adjacent two organic thin-film solar cells are brought into contact with each other, so that the connecting step can be performed at the same time.

When the above steps are performed, the organic thin-film solar cell module shown in FIG. 9A is successfully manufactured.

This mode makes it possible to manufacture an organic thin-film solar cell module having a single first electrode substrate and a plurality of second electrode substrates, and thus makes it possible to manufacture an organic thin-film solar cell module with good workability.

Hereinafter, each step of the method for manufacturing the organic thin-film solar cell module in this mode will be described.

1. First Electrode Substrate Forming Step

In this mode, the first electrode substrate forming step is a step of forming a plurality of first electrode layers on a first substrate to form a first electrode substrate.

Now, the first electrode substrate formed by this step will be described.

The first electrode substrate formed by this step includes a single first substrate and first electrode layers formed on the first substrate.

The first electrode layer may be an electrode for extracting holes generated in the photoelectric conversion layer (hole extraction electrode) or an electrode for extracting electrons generated in the photoelectric conversion layer (electron extraction electrode).

The first electrode substrate may be a substrate having transparency or no transparency, which may be appropriately selected depending on which side is used as the light receiving surface for the organic thin-film solar cell module manufactured according to this mode.

When the second electrode substrate has transparency, the first electrode substrate formed in this step may be a substrate having transparency or no transparency.

On the other hand, when the second electrode substrate has no transparency, a substrate having transparency is formed as the first electrode substrate in this step.

(1) Substrate Having Transparency

When a substrate having transparency is formed as the first electrode substrate in this step, a transparent substrate is generally used as the first substrate, and transparent electrodes are generally used as the first electrode layers.

The transparent substrate may be the same as that described above in the section "1. First mode," and therefore, a description thereof will be omitted here.

The transparent electrodes may be of any type having conductivity and transparency. Common transparent electrodes may be used, examples of which include In—Zn—O (IZO), In—Sn—O (ITO), ZnO—Al, and Zn—Sn—O.

The total light transmittance, thickness, and pattern of the transparent electrodes, and the method of forming them may be the same as those described in the section on the first mode, and therefore, a description thereof will be omitted here.

When the first electrode layer is a transparent electrode, an auxiliary electrode may be further placed on it. Incidentally, the auxiliary electrode may be the same as that described in the section "1. First mode," and therefore a description thereof will be omitted here.

(2) Substrate Having No Transparency

When a substrate having no transparency is formed as the first electrode substrate in this step, the first substrate described in the section "1. First mode" is used, and conductive layers having no transparency are used as the first electrode layers.

The material used to form the conductive layers may be of any type having conductivity. It is preferred that the material for the conductive layers should be appropriately selected taking into account the work function and other properties of the material used to form the second electrode layer. For example, when a low work function material is used to form the second electrode layer, a high work function material is preferably used to form the first electrode layers. Examples of such a high work function material include Au, Ag, Co, Ni, Pt, C, ITO, $SnO_2$, and fluorine-doped $SnO_2$, ZnO.

On the other hand, when a high work function material is used to form the second electrode layer, a low work function material is preferably used to form the first electrode layers.

Examples of such a low work function material include Li, In, Al, Ca, Mg, Sm, Tb, Yb, Zr, and LiF. Examples of reflective materials include Al, Ag, Cu, and Au.

The thickness, pattern, and other properties of the conductive layers may be the same as those of the transparent electrode described above, and therefore, a description thereof will be omitted here.

(3) Additional Structures

The first electrode substrate formed in this step may have any other additional structure, if necessary, as long as it includes the first electrode substrate and the first electrode layers.

Such additional structures include a hole extraction layer and an electron extraction layer.

(a) Hole Extraction Layer

The first electrode layer of the first electrode substrate formed in this step may be used as a hole extraction electrode. In this case, a hole extraction layer is preferably formed on the first electrode layer.

The hole extraction layer is provided to facilitate the extraction of holes from the photoelectric conversion layer to the hole extraction electrode (transparent electrode layer). This increases the efficiency of the extraction of holes from the photoelectric conversion layer to the hole extraction electrode, so that the photoelectric conversion efficiency can be increased.

In the invention, the material used to form the hole extraction layer may be any material capable of stabilizing the extraction of holes from the photoelectric conversion layer to the hole extraction electrode. Examples include conductive organic compounds such as doped polyaniline, polyphenylene vinylene, polythiophene, polypyrrole, polyparaphenylene, polyacetylene, and triphenyldiamine (TPD); and organic materials that form a charge transfer complex composed of an electron donating compound such as tetrathiofulvalene or tetramethylphenylenediamine and an electron accepting compound such as tetracyanoquinodimethane or tetracyanoethylene. A thin film of a metal or the like, such as Au, In, Ag, or Pd may also be used. The thin film of a metal or the like may be used alone or in combination with the organic material.

In particular, water-dispersible materials are preferably used, such as polyethylenedioxythiophene (PEDOT), polyethylenedioxythiophene-polystyrene sulfonic acid (PEDOT/PSS), polyaniline, and polypyrrole.

In this mode, the material used to form the hole extraction layer is preferably polyethylenedioxythiophene-polystyrene sulfonic acid (PEDOT/PSS). In the bonding step described below, the PEDOT/PSS can have high adhesion to the photoelectric conversion layer in the process of bonding the first and second electrode substrates. In addition, the PEDOT/PSS, which is in the form of an aqueous dispersion, can be mixed with an adhesion improvement material for improving adhesion as described below.

The hole extraction layer composed mainly of PEDOT/PSS may be formed in the functional layer forming step described below.

In the invention, if necessary, the hole extraction layer made of the materials mentioned above may further contain an adhesion improvement material for improving adhesion to the photoelectric conversion layer. When a lamination method is used as mentioned above, the adhesion improvement material can improve adhesion between the photoelectric conversion layer and the hole extraction layer.

The adhesion improvement material may be of any type as long as it does not interfere with the function of the hole extraction layer. A sugar chain or the like is preferably used. This is because a sugar chain is highly adhesive and low cost.

Specifically, D-sorbitol or the like may be used as the sugar chain.

The content of the adhesion improvement material is not particularly restricted as long as it does not interfere with the function of the hole extraction layer. The content of the adhesion improvement material in the materials used to form the hole extraction layer is preferably in the range of 0.1% by weight to 5% by weight, more preferably 0.5% by weight to 3% by weight, and even more preferably in the range of 1% by weight to 2% by weight.

If the content falls within the range, better adhesion can be obtained.

In the invention, the thickness of the hole extraction layer is preferably in the range of 10 nm to 200 nm when produced using the organic material or preferably in the range of 0.1 nm to 5 nm when it is the metal thin film.

In the invention, the hole extraction layer may be formed using any method capable of forming the hole extraction layer with high accuracy. Specifically, the hole extraction layer may be formed using a process including applying a hole extraction layer-forming coating liquid containing the above materials, drying the coating, and then baking the coating.

(b) Electron Extraction Layer

The first electrode layer of the first electrode substrate formed in this step may be used as an electron extraction electrode. In this case, an electron extraction layer is preferably formed on the first electrode layer.

The electron extraction layer is provided to facilitate the extraction of electrons from the photoelectric conversion layer to the electron extraction electrode. This increases the efficiency of the extraction of electrons from the photoelectric conversion layer to the electron extraction electrode, so that the photoelectric conversion efficiency can be increased.

The material used to form the electron extraction layer may be any material capable of stabilizing the extraction of electrons from the photoelectric conversion layer to the electron extraction electrode, and may be appropriately selected depending on the type of the photoelectric conversion part as mentioned above. Examples include inorganic materials such as alkaline-earth metals such as Ca, alkali or alkaline-earth metal fluorides such as LiF and $CaF_2$, and metal oxides such as titanium oxide and zinc oxide; conductive organic compounds such as doped polyaniline, polyphenylene vinylene, polythiophene, polypyrrole, polyparaphenylene, polyacetylene, and triphenyldiamine (TPD); or organic materials that form a charge transfer complex composed of an electron donating compound such as tetrathiofulvalene or tetramethylphenylenediamine and an electron accepting compound such as tetracyanoquinodimethane or tetracyanoethylene. Examples also include alkali or alkaline-earth metal-doped layers. Preferred materials include metal-doped layers such as bathocuproin (BCP) or bathophenanthron (Bphen) and Li, Cs, Ba, Sr, or the like.

Among the materials mentioned above, titanium oxide is preferably used to form the electron extraction layer. Titanium oxide resists degradation even when stored in the air, and its efficiency of electron extraction is less likely to decrease, so that it can form an organic thin-film solar cell module with high cell performance.

In the invention, the surface roughness Ra of the electron extraction layer is preferably 1.0 μm or less, although it may be at any level making possible stable use of the organic thin-film solar cell module. In particular, the surface roughness Ra is preferably 0.5 μm or less, and more preferably 0.3 μm or less.

When the surface roughness falls within the range, the first and second electrode layers in one organic thin-film solar cell of the organic thin-film solar cell module can be more stably prevented from accidentally coming into contact with each other to cause an internal short.

Incidentally, the surface roughness Ra can be determined using the method according to JIS B 0601-1994.

In the invention, the electron extraction layer may have any thickness that enables easy extraction of electrons from the photoelectric conversion layer to the first electrode layer. The thickness of the electron extraction layer is preferably in the range of 50 nm to 5,000 nm. In particular, it is preferably in the range of 50 nm to 1,000 nm, and more preferably in the range of 50 nm to 300 nm.

When the thickness falls within the range, the electron extraction layer can be formed with a reduced number of pinholes and other defects. In addition, such an electron extraction layer can satisfactorily cover the surface of the first electrode layer.

In the invention, the electron extraction layer may be formed at any location (in planar view) where there is a region in which the first electrode layer and the photoelectric conversion layer described below overlap each other in planar view. Preferably, the electron extraction layer should be formed at the whole of the region where the first electrode layer and the photoelectric conversion layer overlap each other in planar view. This is because high photoelectric conversion efficiency can be achieved.

The electron extraction layer may be formed using any method capable of uniformly forming it in a pattern with a predetermined thickness. It may be formed using any of wet and dry processes, which may be appropriately selected depending on materials.

(4) First Electrode Substrate Forming Method

In this step, the first electrode substrate may be formed using any method capable of forming it in such a manner that the desired organic thin-film solar cell module can be obtained. Preferably, the first electrode substrate is formed using an R-to-R process.

2. Second Electrode Substrate Preparing Step

In this mode, the second electrode substrate preparing step is a step of preparing a single piece of second electrode substrate-forming base material having the second electrode layer and capable of being cut into the plurality of second electrode substrates.

The second electrode substrate-forming base material prepared by this step will be described.

In this step, the second electrode layer of the second electrode substrate-forming base material is a counter electrode to the first electrode layer. The second electrode layer may be an electrode for extracting holes generated in the photoelectric conversion layer (hole extraction electrode) or an electrode for extracting electrons generated in the photoelectric conversion layer (electron extraction electrode).

The second electrode substrate-forming base material may have transparency or no transparency, which may be appropriately selected depending on which side is used as the light receiving surface for the organic thin-film solar cell module. If the light-receiving surface is on the second electrode substrate side, the second electrode substrate-forming base material needs to have transparency. If the light-receiving surface is on the first electrode layer side, the second electrode substrate-forming base material may have transparency or no transparency. To form a see-through, organic thin-film solar cell module, the second electrode substrate-forming base material needs to have transparency.

The second electrode substrate-forming base material may be made of a second electrode layer itself or may include a second electrode layer and a second substrate.

In the second electrode substrate-forming base material including a second electrode layer and a second substrate, the second electrode layer and the second substrate may be made of the same materials as those for the first electrode layer and the first substrate described above.

The second electrode substrate-forming base material may be made of a second electrode layer. In this case, a single metal layer, specifically, a metal base material is generally used as the second electrode substrate-forming base material.

The metal used to form the metal substrate may be of any type having conductivity. Preferably, the metal is appropriately selected taking into account the work function and other properties of the material used to form the first electrode layer.

Specifically, the metal may be selected in the same manner as described above in the section on the first electrode substrate forming step, and therefore, a description thereof will be omitted here.

The form of the second electrode substrate-forming base material may be the same as that of the second electrode substrate-forming base material described above in the section on the first mode, and therefore, a description thereof will be omitted here.

The second electrode substrate-forming base material prepared in this step may have any other structure than the above.

For example, when the second electrode layer is used as a hole extraction electrode, a hole extraction layer is preferably formed on the second electrode layer. On the other hand, when the second electrode layer is used as an electron extraction electrode, an electron extraction layer is preferably formed on the second electrode layer.

Incidentally, the hole and electron extraction layers may be the same as those described above in the section on the first electrode substrate forming step, and therefore, a description thereof will be omitted here.

3. Functional Layer Forming Step

In this mode, the functional layer forming step is a step of either forming functional layers on the first electrode layer side of the first electrode substrate, in which the functional layers are formed in a pattern corresponding to the pattern of the first electrode layers, or continuously forming a functional layer on the second electrode layer side of the second electrode substrate-forming base material.

In this mode, the expression "the functional layers are formed in a pattern corresponding to the pattern of the first electrode layers" means that each functional layer is formed on each first electrode layer in such a manner that the functional layer is contained in each organic thin-film solar cell constituting the organic thin-film solar cell module manufactured by the method in this mode.

As mentioned above, the functional layer formed in this step is an organic material-containing layer formed between the first and second electrode layers. More specifically, the functional layer may be a photoelectric conversion layer or a hole extraction layer composed mainly of PEDOT/PSS.

In the following discussion, therefore, this step can be divided into two modes: a mode where the functional layer to be formed is a photoelectric conversion layer (first embodiment); and another mode where the functional layer to be formed is a hole extraction layer composed mainly of PEDOT/PSS (hereinafter, also referred to as the "functional hole extraction layer" in the description) (second embodiment).

Hereinafter, each embodiment will be described.

(1) First Embodiment

In this embodiment, the functional layer forming step includes either forming photoelectric conversion layers on the first electrode layer side of the first electrode substrate, in which the photoelectric conversion layers are formed in a pattern corresponding to the pattern of the first electrode layers, or continuously forming a photoelectric conversion layer on the second electrode layer side of the second electrode substrate-forming base material.

Now, the photoelectric conversion layer formed in this step will be described.

(a) Photoelectric Conversion Layer

The photoelectric conversion layer for use in this embodiment is formed between the first and second electrode layers in the organic thin-film solar cell module manufactured by the method in this mode. Incidentally, as used herein, the term "photoelectric conversion layer" refers to a member that contributes to charge separation in an organic thin-film solar cell and transports generated electrons and holes to opposite electrodes.

The photoelectric conversion layer used in this embodiment may be a single layer having both an electron accepting function and an electron donating function (mode A) or a laminate of an electron accepting layer having an electron accepting function and an electron donating layer having an electron donating function (mode B).

Hereinafter, each mode will be described.

(i) Mode A

In this embodiment, the photoelectric conversion layer in mode A is a single layer having both an electron accepting function and an electron donating function, which contains an electron accepting material and an electron donating material. In this photoelectric conversion layer, charge separation is generated based on the p-n junction formed therein, so that it functions by itself.

The electron donating material in the photoelectric conversion layer may be of any type having a function as an electron donor. The electron donating material is preferably capable of being formed into a film by a wet coating method, and in particular, it is preferably an electron-donating, conductive, polymer material.

The conductive polymer is what is called π-conjugated polymer, which includes a π-conjugated system, in which a carbon-carbon or heteroatom-containing double or triple bond and a single bond are linked alternately, and exhibits semiconducting properties. The conductive polymer material has developed π-conjugation in the main polymer chain and therefore is basically advantageous in transporting charges in the main chain direction.

In addition, the electron transfer mechanism of the conductive polymer is mainly hopping conduction between π-stacked molecules, and therefore, the conductive polymer material is advantageous in transporting charges not only in the main polymer chain direction but also in the thickness direction of the photoelectric conversion layer. When a coating liquid including a solution or dispersion of the conductive polymer material in a solvent is used, a film of the conductive polymer material can be easily formed by a wet coating method. Therefore, the conductive polymer material is advantageous in that a large-area, organic thin-film solar battery can be produced with it by a low cost process without the need for expensive equipment.

Examples of the electron-donating, conductive, polymer material include polyphenylene, polyphenylene vinylene, polysilane, polythiophene, polycarbazole, polyvinylcarbazole, porphyrin, polyacetylene, polypyrrole, polyaniline, polyfluorene, polyvinylpyrene, polyvinylanthracene, derivatives thereof, and copolymers thereof, or phthalocyanine-containing polymers, carbazole-containing polymers, and organometallic polymers.

Among the above, preferably used are thiophene-fluorene copolymers, polyalkylthiophene, phenylene ethynylene-phenylene vinylene copolymers, phenylene ethynylene-thiophene copolymers, phenylene ethynylene-fluorene copolymers, fluorene-phenylene vinylene copolymers, and thiophene-phenylene vinylene copolymers. These are appropriately different in energy level from many electron accepting materials.

Incidentally, for example, a detailed method for synthesis of a phenylene ethynylene-phenylene vinylene copolymer (poly[1,4-phenyleneethynylene-1,4-(2,5-dioctadodecyloxyphen ylene)-1,4-phenyleneethene-1,2-diyl-1,4-(2,5-diocta-dodecylo xyphenylene)ethene-1,2-diyl]) is described in Macromolecules, 35, 3825 (2002) or Mcromol. Chem. Phys., 202, 2712 (2001).

The electron accepting material may be of any type having a function as an electron acceptor. The electron accepting material is preferably capable of being formed into a film by a wet coating method, and in particular, it is preferably an electron-accepting, conductive, polymer material. The conductive polymer material has advantages as described above.

Examples of the electron-accepting, conductive, polymer material for use in this mode include polyphenylene vinylene, polyfluorene, derivatives thereof, and copolymers thereof, or carbon nanotubes, fullerene derivatives, CN or $CF_3$ group-containing polymers, and $-CF_3$-substituted polymers thereof. Examples of polyphenylene vinylene derivatives include CN—PPV (poly[2-methoxy-5-(2'-ethylhexyloxy)-1,4-(1-cyanovinylene]) and MEH—CN—PPV (poly[2-methoxy-5-(2'-ethylhexyloxy)-1,4-(1-cyanovinylene]).

An electron accepting material doped with an electron donating compound or an electron donating material doped with an electron accepting compound may also be used. In particular, a conductive polymer material doped with such an electron donating or accepting compound is preferably used. This is because the conductive polymer material has developed π-conjugation in the main polymer chain and therefore is basically advantageous in transporting charges in the main chain direction and because charges are produced in the π-conjugated main chain by the doping with an electron donating compound or an electron accepting compound so that the electric conductivity can be significantly increased.

The above electron-accepting, conductive, polymer material may be used and doped with the electron donating compound. Examples of the electron donating compound that may be used as a dopant include Lewis bases such as alkali metals and alkaline earth metals, such as Li, K, Ca, and Cs. Incidentally, lewis bases act as electron donors.

The above electron-donating, conductive, polymer material may be used and doped with the electron accepting compound. Examples of the electron accepting compound that may be used as a dopant include Lewis acids such as $FeCl_3$ (III), $AlCl_3$, $AlBr_3$, $AsF_6$, and halogen compounds. Incidentally, lewis acids act as electron acceptors.

In this mode, the mixing ratio between the electron donating material and the electron accepting material is appropriately controlled to be optimal depending on the type of the materials used.

In this mode, the thickness of the photoelectric conversion layer used may be that used in a common bulk hetero-junction organic thin-film solar cell. Specifically, the thickness is preferably set in the range of 0.2 nm to 3,000 nm, and more preferably in the range of 1 nm to 600 nm.

If the thickness exceeds the above range, the volume resistance of the photoelectric conversion layer may increase. If the thickness is blow the above range, the layer may fail to sufficiently absorb light.

In this mode, although the photoelectric conversion layer may be formed by any method capable of uniformly forming a film with a predetermined thickness, it is preferably formed using a wet coating method. When a wet coating method is used, the photoelectric conversion layer can be formed in the air, so that the cost can be reduced and a large-area product can be easily formed.

In this mode, a coating liquid for forming the photoelectric conversion layer may be applied by any method capable of uniformly applying the coating liquid, such as die coating, spin coating, dip coating, roll coating, bead coating, spray coating, bar coating, gravure coating, inkjet process, screen printing, or offset printing.

In particular, a coating liquid for forming the photoelectric conversion layer is preferably applied by a method capable of controlling the thickness mainly based on the amount of coating. Examples of such a method capable of controlling the thickness mainly based on the amount of coating include die coating, bead coating, bar coating, gravure coating, inkjet process, and printing methods such as screen printing and offset printing. Printing methods are advantageous in forming a large-area organic thin-film solar battery.

After a coating liquid for forming the photoelectric conversion layer is applied, the coating film formed may be subjected to a drying process. In this case, the solvent and so on can be quickly removed from a coating liquid for forming the photoelectric conversion layer so that productivity can be increased.

The drying process may be performed using a common drying method such as drying by heating, drying by blowing, vacuum drying, or drying by infrared heating.

(ii) Mode B

In this embodiment, the photoelectric conversion layer in mode B is a laminate of an electron accepting layer having an electron accepting function and an electron donating layer having an electron donating function.

Hereinafter, the electron accepting layer and the electron donating layer will be described.

(Electron Accepting Layer)

The electron accepting layer used in this mode has an electron accepting function and contains an electron accepting material.

Such an electron accepting material may be of any type having a function as an electron acceptor. The electron accepting material is preferably capable of being formed into a film by a wet coating method, and in particular, it is preferably an electron-accepting, conductive, polymer material. Such a conductive polymer material has the advantages described above. Specifically, the conductive polymer material may be the same as the electron-accepting, conductive, polymer material for use in the first mode of the photoelectric conversion layer.

In this mode, the thickness of the electron accepting layer used may be that used in a common bilayer organic thin-film solar cell. Specifically, the thickness may be set in the range of 0.1 nm to 1,500 nm, and preferably in the range of 1 nm to 300 nm. If the thickness exceeds the above range, the volume resistance of the electron accepting layer may increase. If the thickness is below the above range, the layer may fail to sufficiently absorb light.

In this mode, the electron accepting layer may be formed by the same method as the method of forming the first mode of the photoelectric conversion layer.

(Electron Donating Layer)

The electron donating layer used in this mode has an electron donating function and contains an electron donating material.

In this mode, such an electron donating material may be of any type having a function as an electron acceptor. The electron donating material is preferably capable of being formed into a film by a wet coating method, and in particular, it is preferably an electron-donating, conductive, polymer material. Such a conductive polymer material has the advantages described above. Specifically, the conductive polymer material may be the same as the electron-donating, conductive, polymer material for use in the first mode of the photoelectric conversion layer.

In this mode, the thickness of the electron donating layer used may be that used in a common bilayer organic thin-film solar cell. Specifically, the thickness may be set in the range of 0.1 nm to 1,500 nm, and preferably in the range of 1 nm to 300 nm. If the thickness exceeds the above range, the volume resistance of the electron donating layer may increase. If the thickness is below the above range, the layer may fail to sufficiently absorb light.

In this mode, the electron donating layer may be formed by the same method as the method of forming the first mode of the photoelectric conversion layer.

(b) Photoelectric Conversion Layer Forming Method

In this step, an R-to-R process is preferably used to form the photoelectric conversion layer regardless of whether the photoelectric conversion layers are formed in a pattern on the first electrode substrate or the photoelectric conversion layer is continuously formed on the second electrode substrate-forming base material.

(2) Second Embodiment

In this embodiment, the functional layer forming step is a step of either forming functional hole extraction layers on the first electrode layer side of the first electrode substrate, in which the functional hole extraction layers are formed in a pattern corresponding to the pattern of the first electrode layers, or continuously forming a functional hole extraction layer on the second electrode layer side of the second electrode substrate-forming base material.

Incidentally, when the second embodiment of the functional layer forming step is performed in the method for manufacturing the organic thin-film solar cell module in this mode, a step of forming the photoelectric conversion layer either on the first electrode layer or on the second electrode layer is additionally performed as described in the section "(1) First mode."

The functional hole extraction layer formed by this step is composed mainly of PEDOT/PSS. Incidentally, the functional hole extraction layer may be the same as that described above in the section on the first electrode substrate forming step, and therefore, a description thereof will be omitted here.

In this step, the functional hole extraction layer may be formed on the electrode layer for use as a hole extraction electrode, which may be either the first electrode layer of the first electrode substrate or the second electrode layer of the second electrode substrate-forming base material. Alternatively, when the photoelectric conversion layer is formed on the first or second electrode layer not used as the hole extraction electrode, the functional hole extraction layer may be formed on the photoelectric conversion layer.

In this step, an R-to-R process is preferably used to form the functional layer regardless of whether the functional hole extraction layers are formed in a pattern on the first electrode substrate side or the functional hole extraction layer is continuously formed on the second electrode substrate-forming base material.

4. Cutting Step

In this mode, the cutting step is a step of cutting the second electrode substrate-forming base material to form the plurality of second electrode substrates.

The cutting step in this mode may be the same as described above in the section on the first mode, and therefore, a description thereof will be omitted here.

5. Bonding Step

In this mode, the bonding step is a step of opposing and bonding the first electrode layer side of the first electrode substrate and the second electrode layer side of the second electrode substrate to each other with the functional layer interposed therebetween so that the first and second electrode substrates are bonded together.

In this step, for example, the photoelectric conversion layer may be placed as the functional layer at the interface. In this case, the photoelectric conversion layer formed on the surface of either the first electrode layer of the first electrode substrate or the second electrode layer of the second electrode substrate is opposed to the electrode layer on the side where the photoelectric conversion layer is not formed, and the first and second electrode substrates are bonded together. In this case, either the hole extraction layer or the electron extraction layer may be formed on the first or second electrode layer as mentioned above.

Alternatively, in this step, for example, the functional hole extraction layer may be placed as the functional layer at the interface. In this case, the functional hole extraction layer formed on the photoelectric conversion layer, which is formed on the surface of either the first electrode layer of the first electrode substrate or the second electrode layer of the second electrode substrate, is opposed to the electrode layer on the side where the functional hole extraction layer is not formed, and the first and second electrode substrates are bonded together.

Alternatively, in this step, for example, the photoelectric conversion layer and the functional hole extraction layer may be placed as the functional layer at the interface. In this case, the photoelectric conversion layer formed on the surface of either the first electrode layer of the first electrode substrate or the second electrode layer of the second electrode substrate is opposed to the functional hole extraction layer formed on the electrode layer on the side where the photoelectric conversion layer is not formed, and the first and second electrode substrates are bonded together.

In this step, the first and second electrode substrates may be bonded using any bonding method capable of bonding the first and second electrode substrates together with the functional layer interposed therebetween.

In this step, when the functional hole extraction layer is placed at the interface during bonding, hot press bonding is preferably performed because PEDOT/PSS exhibits good adhesion in a given temperature range.

The hot press bonding is preferably performed in the temperature range of 100° C. to 150° C., although it may be performed in any temperature range where PEDOT/PSS can exhibit good adhesion as mentioned above. In particular, it is preferably performed in the temperature range of 110° C. to 140° C., and more preferably in the temperature range of 120° C. to 130° C.

If it is below the temperature range, PEDOT/PSS may fail to exhibit such adhesion that the first and second electrode substrates can be sufficiently bonded together. If it exceeds the temperature range, the first substrate of the first electrode substrate may degrade.

In general, the pressure during the hot press bonding is preferably in the range of 0.1 MPa to 1 MPa, although the hot press bonding may be performed at any pressure where the first and second electrode substrates can be bonded together with PEDOT/PSS exhibiting adhesion in the above temperature range. In particular, the pressure is preferably in the range of 0.2 MPa to 0.8 MPa, and more preferably in the range of 0.4 MPa to 0.5 MPa.

If the pressure is below the range, adhesion between the first and second electrode substrates may be insufficient. If the pressure exceeds the range, a laminate of the first and second electrode substrates may undergo excessive structural change to form an organic thin-film solar cell with lower cell performance.

The hot press bonding may be performed in any atmosphere that does not degrade the properties of each component layer of the first and second electrode substrates. Examples of such an atmosphere include vacuum, nitrogen, and air. Vacuum and nitrogen are particularly preferred.

6. Connecting Step

In this mode, the connecting step is a step of electrically connecting the first electrode layer of one of the organic solar cells to the second electrode layer of another organic solar cell which is adjacent to the one organic solar cell.

The connecting step in this mode may be the same as that described above in the section on the first mode, and therefore, a description thereof will be omitted here.

7. Other Steps

If necessary, any other steps may be selected and added to the method for manufacturing the organic thin-film solar cell module in this mode, as long as the manufacturing method includes the steps each described above. Specifically, such other steps may be the same as those described in the section "I. First mode," and therefore, a description thereof will be omitted here.

Incidentally, the above embodiments are not intended to limit the invention. The above embodiments are described by way of example only, and it will be understood that many variations are possible with substantially the same feature as the technical idea recited in the claims to produce the same effect, and all of such variations are within the scope of the invention.

EXAMPLES

Hereinafter, the invention will be more specifically described with reference to examples.

Example 1

Dye-Sensitized Solar Cell Module

<Preparation of First Electrode Substrate>

A transparent conductive film having a PEN film (first substrate) and an ITO film (first electrode layer) formed thereon was provided, and platinum (catalyst layer) was deposited with a thickness of 13 Å (72% in transmittance) on the ITO film. The resulting laminate of the first electrode layer and platinum was subjected to laser scribing so that insulating parts were formed. The intervals between the insulating parts were 100 mm in the longitudinal direction and 12 mm in the short length direction. As a result, a first electrode substrate was obtained, which had a single first substrate and a plurality of first electrode layers and catalyst layers formed on the first substrate.

<Preparation of Porous Layer-Forming Composition>

To 16.7 g of ethanol were added 5 g of porous titanium oxide fine particles (P25 (trade name) manufactured by Nippon Aerosil Co., Ltd.), 0.25 g of acetyl acetone, and 20 g of zirconia beads (1.0 mmφ). While the resulting mixture liquid was stirred using a paint shaker, 0.25 g of polyvinylpyrrolidone (K-30 (trade name) manufactured by NIPPON SHOKUBAI CO., LTD.) as a binder was further added to the mixture, so that a porous layer-forming composition was obtained.

<Formation of Porous Layer>

The resulting porous layer-forming composition was applied to a 10 cm wide area of a titanium foil (second electrode substrate-forming base material) as a conductive base material using a doctor blade method. The coating was then dried at 120° C. to form a 9 μm thick layer containing a large number of the titanium oxide fine particles. A pressure of 0.1 t/cm$^2$ was applied to the layer of the titanium oxide fine particles using a pressing machine. After the pressing, the layer was fired at 500° C. for 30 minutes, so that a porous layer-forming film was obtained.

<Adsorption of Dye>

Subsequently, an organic dye (D358 (trade name) manufactured by Mitsubishi Paper Mills Ltd.) as a sensitizing dye was dissolved at a concentration of $3.0 \times 10^{-4}$ mol/l in a solution of acetonitrile and tert-butyl alcohol (1:1 in volume ratio) to form a coating liquid for dye deposition. The porous layer-forming film formed on the conductive base material was immersed for 3 hours in the coating liquid for dye deposition. Subsequently, the porous layer-forming film was lifted out of the coating liquid for dye deposition, and unnecessary part of the coating liquid on the porous layer-forming film was cleaned off with acetonitrile, which was followed by air drying. As a result, the sensitizing dye was deposited on the porous surfaces of the titanium oxide fine particles, so that a porous layer was obtained.

<Preparation of Electrolyte Layer-Forming Coating Liquid>

A solution was prepared by dissolving 0.14 g of cationic hydroxycellulose (Jellner QH200 (trade name) manufactured by Daicel Corporation) in 2.72 g of ethanol, and 0.043 g of potassium iodide was added to the solution and dissolved by stirring. Subsequently, 0.18 g of 1-ethyl-3-methylimidazolium tetracyanoborate (EMIm-B(CN)4), 0.5 g of 1-propyl-3-methylimidazolium iodide (PMIm-I), and 0.025 g of I$_2$ were added to the solution and dissolved by stirring. As a result, a coatable electrolyte layer-forming coating liquid was obtained.

<Formation of Solid Electrolyte Layer>

The electrolyte layer-forming coating liquid was applied to the porous layer (10 cm wide) using a doctor blade method and dried at 100° C. to form an electrolyte layer.

<Cutting Second Electrode Substrate-Forming Base Material>

The second electrode substrate-forming base material with the electrolyte layer formed thereon was cut into 10 mm wide strips in such a manner that its parts with no porous layer formed longitudinal ends, so that second electrode substrates were obtained.

<Preparation of Dye-Sensitized Solar Cell Module>

A conductive adhesive was applied to a porous layer-free region of each strip-shaped second electrode substrate. Subsequently, the first electrode substrate and the second electrode substrates were bonded together in such a manner that the conductive adhesive was connected to the adjacent first electrode layer, so that a module was formed.

<Connection>

The ITO and Ti of adjacent cells were connected to each other with the conductive adhesive, so that a dye-sensitized solar cell module was obtained.

<Sealing>

The resulting dye-sensitized solar cell module was sandwiched between sealing materials and subjected to lamination at 150° C., so that a sealed product was obtained.

<Evaluation of Cell Performance>

The current-voltage characteristics of the resulting dye-sensitized solar cell module were measured using a solar simulator (AM 1.5, incident light power 100 mW/cm$^2$) as a light source, from which light was applied to the counter electrode side, and using a source measure unit (Keithley Model 2400) for the voltage application. As a result, the following characteristics were obtained: short-circuit current, 23 (mA); open-circuit voltage, 6.1 (V); fill factor, 0.24; and maximum output, 32 mW. When a fluorescent lamp (500 lux) was used as a light source, the following characteristics were obtained: short-circuit current, 0.25 (mA); open-circuit voltage, 4.7 (V); fill factor, 0.70; and maximum output, 0.8 mW.

Example 2

Organic Thin-Film Solar Cell Module

<Preparation of Electron Extraction Layer>

A transparent conductive film having a PEN film (first substrate) and an ITO film (first electrode layer) formed thereon was provided. Sorbitol was added at a concentration of 2 wt % (solid basis) to a conductive polymer paste (a dispersion of poly-(3,4-ethylenedioxythiophene)). The resulting mixture was applied to the film by die coating and dried at 150° C. for 30 minutes to form an electron extraction layer. The resulting substrate was patterned by laser-beam machining so that ten first electrode layer areas were formed, each with an electrode area of 100 mm×12 mm.

<Preparation of Photoelectric Conversion Layer>

A photoelectric conversion layer-forming coating liquid was then prepared. Polythiophene (poly(3-hexylthiophene-2,5-diyl) (P3HT)) and electron-accepting fullerene ([6,6]-phenyl-C61-butyric acid methyl ester (PCBN)) were mixed in a weight ratio of 5:2 and dissolved in chlorobenzene to form a chlorobenzene solution with a solid concentration of 1.0 wt %. Finally, the solution was filtered through a paper filter to give a photoelectric conversion layer-forming coating liquid.

Subsequently, the solution was applied to a 30 μm thick Ti foil by spin coating at a speed of 700 rpm to form a photoelectric conversion layer (150 nm in thickness).

The Ti foil with the resulting photoelectric conversion layer was cut into 10 mm wide strips, so that a plurality of second electrode substrates (photoelectric conversion electrode substrates) was obtained.

<Bonding>

Subsequently, each of the resulting photoelectric conversion electrode substrates was bonded to each patterned electron extraction layer, and subjected to lamination using a roll laminator under the conditions of a lamination pressure of 4 kgf/cm$^2$ and a lamination temperature of 130° C., so that a plurality of cells were formed on the substrate.

<Connection>

The ITO and Ti foil of adjacent cells were connected to each other with a conductive adhesive, so that an organic thin-film solar cell module was obtained.

<Sealing>

Finally, the organic thin-film solar cell module was sealed with a sealing glass material and an adhesive sealing material.

<Evaluation of Cell Performance>

The current-voltage characteristics of the resulting organic thin-film solar cell module were measured using a solar simulator (AM 1.5, incident light power 100 mW/cm$^2$) as a light source, from which light was applied to the counter electrode side, and using a source measure unit (Keithley Model 2400) for the voltage application. As a result, the following characteristics were obtained: short-circuit current, 30 (mA); open-circuit voltage, 7.0 (V); fill factor, 0.24; and maximum output, 50.4 mW. When a fluorescent lamp (500 lux) was used as a light source, the following characteristics were obtained: short-circuit current, 0.30 (mA); open-circuit voltage, 5.0 (V); fill factor, 0.71; and maximum output, 1.1 mW.

REFERENCE SIGNS LIST

1: Dye-sensitized solar cell
2: Organic thin-film solar cell
3: Porous layer
4: Solid electrolyte layer
5: Catalyst layer
6: Photoelectric conversion layer
7: Hole extraction layer
8: Electron extraction layer
10: First electrode substrate
11: First substrate
12: First electrode layer
20: Second electrode substrate
20': Second electrode substrate-forming base material
100: Dye-sensitized solar cell module
200: Organic thin-film solar cell module

The invention claimed is:

1. A method for manufacturing an organic solar cell module comprising:
a first electrode substrate having a single first substrate and a plurality of first electrode layers formed in a pattern on the first substrate;
a plurality of second electrode substrates each having at least a second electrode layer; and
a plurality of functional layers each formed between the first electrode layer and the second electrode layer and containing an organic material, wherein the organic solar cell module comprises a plurality of connected organic solar cells each having the first electrode layer, the second electrode layer, and the functional layer, the method comprising steps of:
a first electrode substrate forming step of forming the plurality of first electrode layers on the first substrate to form the first electrode substrate;
a second electrode substrate-forming base material preparing step of preparing a single piece of second electrode substrate-forming base material having at least the second electrode layer and capable of being cut into the plurality of second electrode substrates;
a functional layer forming step of either forming the functional layers on a side of the first electrode layer of the first electrode substrate, in which the functional layers are formed in a pattern corresponding to the pattern of the first electrode layers, or continuously forming the functional layer on a side of the second electrode layer of the second electrode substrate-forming base material;
a cutting step of cutting the second electrode substrate-forming base material to form the plurality of second electrode substrates;
a bonding step of opposing and bonding the first electrode layer side of the first electrode substrate and the second electrode layer side of the second electrode substrate to each other with the functional layer interposed therebetween so that the first electrode substrate and the second electrode substrate are bonded together; and
a connecting step of electrically connecting the first electrode layer of one of the organic solar cells to the second electrode layer of another organic solar cell which is adjacent to the one organic solar cell.

2. The method for manufacturing an organic solar cell module according to claim 1, wherein the first substrate is a long flexible substrate wound into a roll shape, and
the first electrode substrate forming step and the functional layer forming step of forming the functional layers on the first electrode layer side of the first electrode substrate are performed using a roll-to-roll process.

3. The method for manufacturing an organic solar cell module according to claim 1, wherein the second electrode substrate-forming base material is a long flexible base material wound into a roll shape, and
the functional layer forming step of forming the functional layer on the second electrode layer side of the second electrode substrate-forming base material is performed using a roll-to-roll process.

4. The method for manufacturing an organic solar cell module according to claim 1, wherein the organic solar cell module is a dye-sensitized solar cell module that comprises a plurality of connected dye-sensitized solar cells each having a porous layer provided on a surface of either the first electrode layer or the second electrode layer, in which the porous layer contains sensitizing dye-bearing fine particles of metal oxide semiconductor, and the functional layer is a solid electrolyte layer containing a polymer compound and a redox couple.

5. The method for manufacturing an organic solar cell module according to claim 4, wherein the second electrode layer is a metal layer, and the porous layer is formed on the metal layer.

6. The method for manufacturing an organic solar cell module according to claim 1, wherein the organic solar cell module is an organic thin-film solar cell module comprising a plurality of connected organic thin-film solar cells each having a photoelectric conversion layer between the first electrode layer and the second electrode layer, characterized in that the functional layer is an organic material-containing layer formed between the first electrode layer and the second electrode layer.

* * * * *